(12) United States Patent
Yun et al.

(10) Patent No.: US 11,551,620 B2
(45) Date of Patent: Jan. 10, 2023

(54) GATE DRIVER CIRCUIT AND DISPLAY DEVICE INCLUDING THE SAME

(71) Applicant: LG Display Co., Ltd., Seoul (KR)

(72) Inventors: Seongho Yun, Paju-si (KR); Dongmyoung Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/553,406

(22) Filed: Dec. 16, 2021

(65) Prior Publication Data
US 2022/0199034 A1 Jun. 23, 2022

(30) Foreign Application Priority Data

Dec. 17, 2020 (KR) .................. 10-2020-0177054

(51) Int. Cl.
*G09G 3/3266* (2016.01)
*G09G 3/3258* (2016.01)

(52) U.S. Cl.
CPC ... *G09G 3/3266* (2013.01); *G09G 2300/0842* (2013.01); *G09G 2310/08* (2013.01); *G09G 2320/0214* (2013.01)

(58) Field of Classification Search
CPC .................................................. G09G 3/3266
See application file for complete search history.

(56) References Cited

U.S. PATENT DOCUMENTS

| | | | |
|---|---|---|---|
| 10,546,520 B2 | 1/2020 | Noh et al. | |
| 10,825,539 B2* | 11/2020 | Feng | G09G 3/3208 |
| 10,950,155 B1* | 3/2021 | Xue | G09G 3/20 |
| 11,138,939 B2* | 10/2021 | Zhang | G09G 3/3266 |
| 11,315,460 B1* | 4/2022 | Xue | G09G 3/20 |
| 2018/0337682 A1* | 11/2018 | Takasugi | H03K 21/18 |
| 2019/0103049 A1* | 4/2019 | Noh | G09G 3/3677 |
| 2020/0020266 A1* | 1/2020 | Feng | G11C 19/28 |
| 2020/0074937 A1* | 3/2020 | Choi | G09G 3/3266 |
| 2020/0135115 A1* | 4/2020 | Chang | G09G 3/3266 |
| 2022/0101796 A1* | 3/2022 | Feng | G11C 19/28 |

FOREIGN PATENT DOCUMENTS

KR 10-2019-0014842 A 2/2019

OTHER PUBLICATIONS

U.S. Appl. No. 17/553,368, filed Dec. 16, 2021.

* cited by examiner

*Primary Examiner* — Sepehr Azari
(74) *Attorney, Agent, or Firm* — Birch, Stewart, Kolasch & Birch, LLP

(57) ABSTRACT

A gate driver circuit can include a plurality of stage circuits, in which each of the plurality of stage circuits supplies a gate signal to gate lines arranged in a display panel, and includes an M node, a Q1 node, a Q2 node, a QB node, a line selector, a Q1 node controller, a Q1 node stabilizer, an inverter, a QB node stabilizer, a carry signal output circuit portion, and a gate signal output circuit portion, in which a first low-potential voltage level, a third low-potential voltage level, and a fourth low-potential voltage level for operating the gate driver circuit are set to different values, and the gate driver circuit can have a reduced size and better prevent leakage current while also providing more stable gate signals.

20 Claims, 10 Drawing Sheets

GATE DRIVER CIRCUIT AND DISPLAY DEVICE INCLUDING THE SAME

CROSS-REFERENCE TO RELATED APPLICATION

This application claims priority to Korean Patent Application No. 10-2020-0177054, filed in the Republic of Korea on Dec. 17, 2020, the entire contents of which are expressly incorporated herein by reference into the present application.

BACKGROUND

Field

The present disclosure relates to a gate driver circuit, and a display device including the same. More particularly, the present disclosure relates to a gate driver circuit in which a size thereof is reduced, and a leakage current is suppressed during an operation thereof, and further relates to a display device including the gate driver circuit.

Description of Related Art

Recently, a display device using a flat display panel such as a liquid crystal display device, an organic light-emitting display device, a light-emissive diode display device, and an electrical electrophoretic display device, etc., has been widely used.

A display device can include a pixel having a light-emissive element and a pixel circuit for driving the light-emissive element. For example, the pixel circuit includes a driving transistor that controls a driving current flowing through the light-emissive element, and at least one switching transistor that controls (or programs) a gate-source voltage of the driving transistor according to a gate signal. The switching transistor of the pixel circuit may be switched based on the gate signal output from a gate driver circuit disposed on a substrate of a display panel.

The display device can include a display area where an image is displayed and a non-display area where an image is not displayed. As a size of the non-display area decreases, a size of an edge area or a bezel area of a display device decreases while a size of the display area thereof increases.

SUMMARY OF THE DISCLOSURE

A gate driver circuit is disposed in the non-display area of the display device. As a size of the gate driver circuit decreases, a size of the display area increases.

The gate driver circuit includes a plurality of stage circuits. Each stage circuit includes a plurality of transistors for generating a gate signal. As the number of the transistors included in each stage circuit increases, a size of the stage circuit and thus a size of the gate driver circuit increase. Therefore, in order to reduce the size of the gate driver circuit and increase the size of the display area, it is necessary to reduce the number of the transistors included in each stage circuit.

Further, as the number of operations of a transistor included in each stage circuit increases, characteristics of the transistor, for example, a magnitude of a threshold voltage thereof change. Thus, as the magnitude of the threshold voltage thereof changes, a voltage drop at a control node occurs such that the transistor is not maintained in a completely turned-off state. Thus, leakage current can occur in each stage circuit during the operation of the gate driver circuit. When a gate signal is not output normally due to the leakage current, an image quality of the display device can be deteriorated.

The present disclosure provides embodiments for solving or addressing the above-described technical issues.

Accordingly, a purpose of the present disclosure is to provide a gate driver circuit having a reduced size due to a decrease in the number of transistors constituting a stage circuit, and a display device including the same in which a display area thereof is increased.

Further, a purpose of the present disclosure is to provide a gate driver circuit capable of preventing leakage of current during an operation of the gate driver circuit, thereby ensuring a normal output of a gate signal and preventing deterioration of an image quality of a display device, and to provide a display device including the same.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

A gate driver circuit according to one embodiment of the present disclosure may include a plurality of stage circuits. Each stage circuit supplies a gate signal to each of gate lines arranged in the display panel, and includes an M node, a Q1 node, a Q2 node, and QB node.

In one embodiment of the present disclosure, each stage circuit includes a line selector, a Q1 node controller, a Q1 node stabilizer, an inverter, a QB node stabilizer, a carry signal output module, and a gate signal output module.

In response to an input of a line sensing preparation signal, the line selector charges the M node based on a front carry signal. In response to an input of a reset signal, the line selector charges the Q1 node to a first high-potential voltage level. In response to an input of a panel on signal, the line selector discharges the Q1 node to a third low-potential voltage level.

In response to an input of the front carry signal, the Q1 node controller charges the Q1 node to the first high-potential voltage level. In response to an input of a rear carry signal, the Q1 node controller discharges the Q1 node to the third low-potential voltage level.

The Q1 node stabilizers discharge the Q1 node to the third low-potential voltage level when the QB node has been charged to a second high-potential voltage level.

The inverter changes a voltage level of the QB node based on a voltage level of the Q1 node.

The QB node stabilizer discharges the QB node to a fourth low-potential voltage level in response to an input of the rear carry signal, to an input of the reset signal, and to a charged voltage of the M node.

The gate signal output module operates based on a voltage level of the Q1 node or a voltage level of the QB node to output a gate signal based on a voltage level of a scan clock signal or a first low-potential voltage level.

The carry signal output module operates based on a voltage level of the Q2 node or a voltage level of the QB node to output a carry signal based on a voltage level of a carry clock signal or the fourth low-potential voltage.

In one embodiment of the present disclosure, the first low-potential voltage level, the third low-potential voltage level, and the fourth low-potential voltage level are set to different values.

Further, a display device according to one embodiment of the present disclosure includes a display panel including sub-pixels respectively disposed at intersections between gate lines and data lines, a gate driver circuit for supplying a scan signal to each gate line, a data driver circuit for supplying a data voltage to each data line, and a timing controller that controls an operation timing of each of the gate driver circuit and the data driver circuit.

In one embodiment of the present disclosure, the gate driver circuit may supply a gate signal to each gate line and may include a plurality of stage circuits, each including an M node, a Q1 node, a Q2 node, and a QB node.

In one embodiment of the present disclosure, each stage circuit includes a line selector, a Q1 node controller, a Q1 node stabilizer, an inverter, a QB node stabilizer, a carry signal output module, and a gate signal output module.

In response to an input of a line sensing preparation signal, the line selector charges the M node based on a front carry signal. In response to an input of a reset signal, the line selector charges the Q1 node to a first high-potential voltage level. In response to an input of a panel on signal, the line selector discharges the Q1 node to a third low-potential voltage level.

In response to an input of the front carry signal, the Q1 node controller charges the Q1 node to the first high-potential voltage level. In response to an input of a rear carry signal, the Q1 node controller discharges the Q1 node to the third low-potential voltage level.

The Q1 node stabilizers discharge the Q1 node to the third low-potential voltage level when the QB node has been charged to a second high-potential voltage level.

The inverter changes a voltage level of the QB node based on a voltage level of the Q1 node.

The QB node stabilizer discharges the QB node to a fourth low-potential voltage level in response to an input of the rear carry signal, to an input of the reset signal, and to a charged voltage of the M node.

The gate signal output module operates based on a voltage level of the Q1 node or a voltage level of the QB node to output a gate signal based on a voltage level of a scan clock signal or a first low-potential voltage level.

The carry signal output module operates based on a voltage level of the Q2 node or a voltage level of the QB node to output a carry signal based on a voltage level of a carry clock signal or the fourth low-potential voltage.

In one embodiment of the present disclosure, the first low-potential voltage level, the third low-potential voltage level, and the fourth low-potential voltage level are set to different values.

According to one embodiment of the present disclosure, the number of the transistors constituting the stage circuit of the gate driver circuit may be reduced, while stable operation of the gate driver circuit may be ensured. When the number of the transistors constituting the stage circuit decreases, the size of the gate driver circuit decreases, and thus the size of the display area of the display device increases. Further, a configuration and a design of the stage circuit become simpler due to the reduction in the number of the transistors constituting the stage circuit.

Further, according to one embodiment of the present disclosure, a magnitude of a voltage required for driving the stage circuit is further subdivided. Accordingly, the transistor may be maintained in a completely turned-off state despite a change in a threshold voltage of a transistor constituting the stage circuit. Therefore, the current leakage is prevented during the operation of the gate driver circuit. Preventing occurrence of the leakage current may allow a normal and more stable output of the gate signal from the gate driver circuit to be guaranteed. Thus, the image quality deterioration of the display device is prevented.

Effects of the present disclosure are not limited to the above-mentioned effects, and other effects as not mentioned will be clearly understood by those skilled in the art from following descriptions.

BRIEF DESCRIPTION OF DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
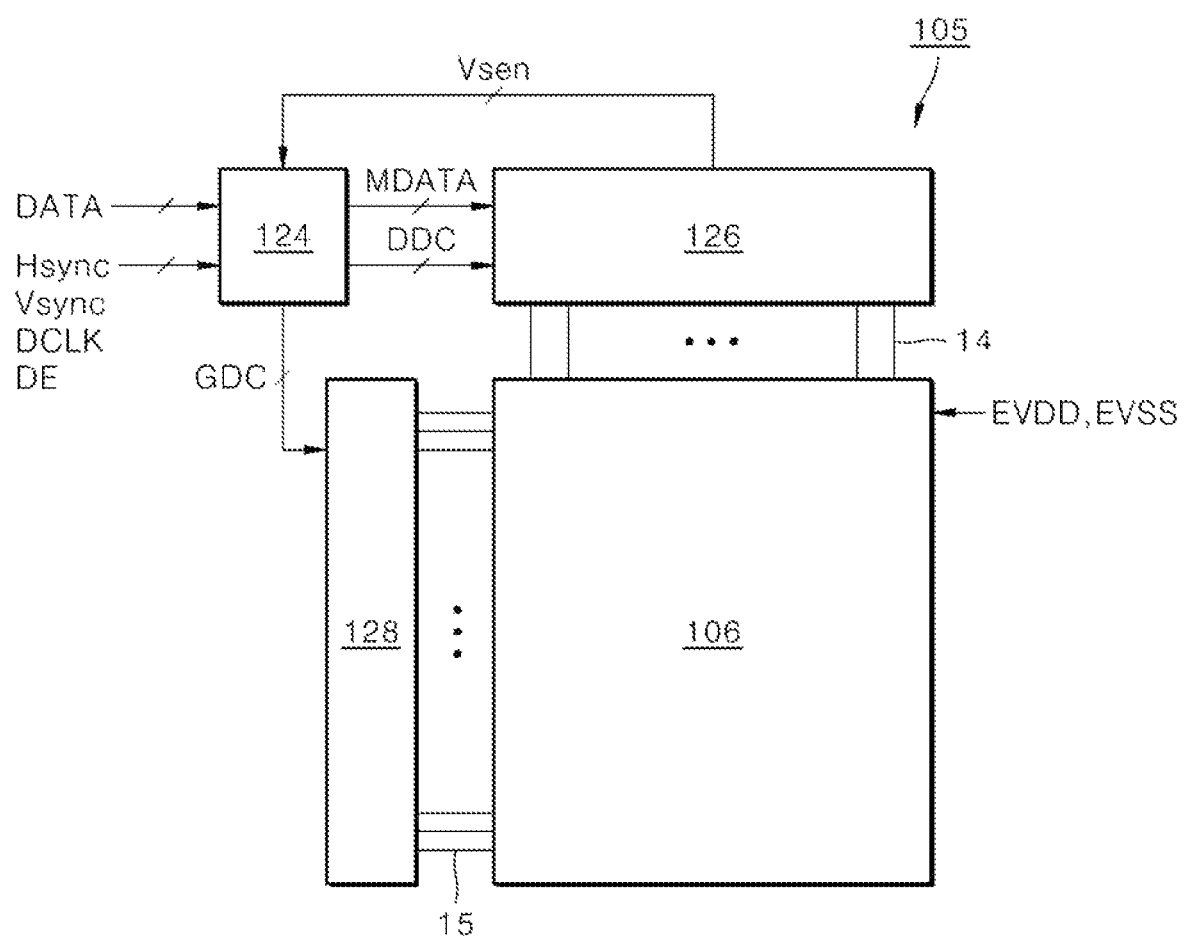
FIG. 1 is a block diagram showing a configuration of a display device according to one embodiment of the present disclosure.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be within the spirit and scope of the present disclosure as defined by the appended claims.

A shape, a size, a ratio, an angle, a number, etc. disclosed in the drawings for describing an embodiments of the present disclosure are examples, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular may constitute "a" and "an" are intended to include the plural may constitute as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D," this means C inclusive to D inclusive unless otherwise specified.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The features of the various embodiments of the present disclosure can be partially or entirely combined with each other, and can be technically associated with each other or operate with each other. An embodiments can be implemented independently of each other and can be implemented together in an association relationship.

In interpreting a numerical value in the disclosure, an error range can be inherent even when there is no separate explicit description thereof.

In a description of a signal flow relationship, for example, when a signal is transmitted from a node A to a node B, the signal can be transmitted from the node A via a node C to the node B, unless an indication that the signal is transmitted directly from the node A to the node B is specified.

In accordance with the present disclosure, each of a sub-pixel circuit and a gate driver circuit formed on a substrate of a display panel can be embodied as a transistor of an n-type MOSFET structure. However, the disclosure is not limited thereto. Each of a sub-pixel circuit and a gate driver circuit formed on a substrate of a display panel can be embodied as a transistor of a p-type MOSFET structure. A transistor can include a gate, a source, and a drain. In the transistor, carriers can flow from the source to the drain. In an n-type transistor, the carrier is an electron and thus a source voltage can be lower than a drain voltage so that electrons can flow from the source to the drain. In an n-type transistor, electrons flow from the source to the drain. A current direction is a direction from the drain to the source. In a p-type transistor, the carrier is a hole. Thus, the source voltage can be higher than the drain voltage so that holes can flow from the source to the drain. In the p-type transistor, the holes flow from the source to the drain. Thus, a direction of current is a direction from the source to the drain. In the transistor of the MOSFET structure, the source and the drain may not be fixed, but can be changed according to an applied voltage. Accordingly, in the present disclosure, one of the source and the drain is referred to as a first source/drain electrode, and the other of the source and the drain is referred to as a second source/drain electrode.

Hereinafter, a preferred example of a gate driver circuit and a display device including the same according to the present disclosure will be described in detail with reference to the accompanying drawings. Across different drawings, the same elements can have the same reference numerals. Moreover, each of scales of components shown in the accompanying drawings is shown to be different from an actual scale for convenience of description. Thus, each of scales of components is not limited to a scale shown in the drawings.

Figure 2:
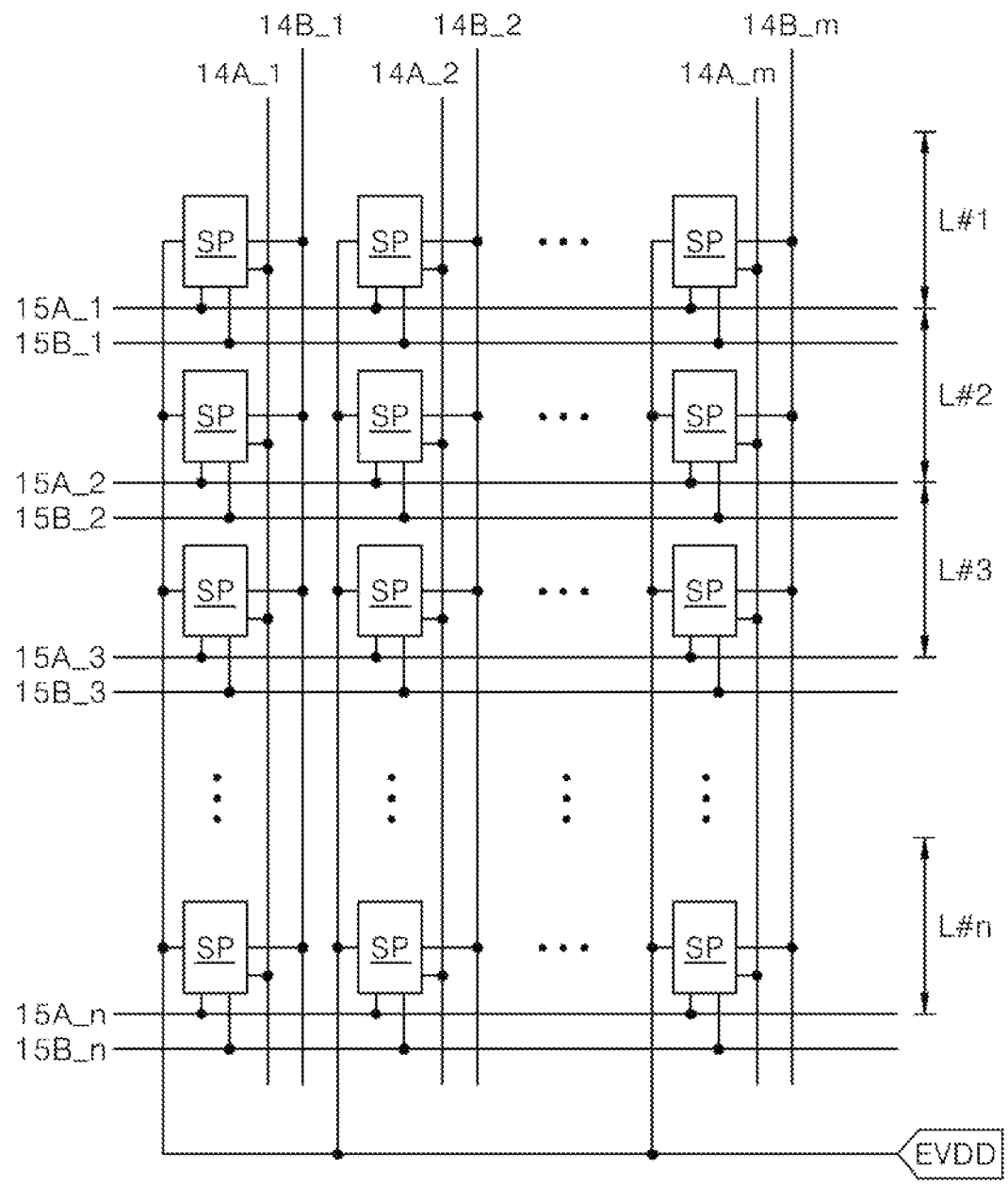
FIG. 2 shows a configuration of a sub-pixel array included in a display panel according to one embodiment of the present disclosure.

FIG. 1 is a block diagram showing a configuration of a display device according to one embodiment of the present disclosure. FIG. 2 shows a configuration of a sub-pixel array included in a display panel according to one embodiment of the present disclosure.

Referring to FIG. 1 and FIG. 2, a display device 1 according to one embodiment of the present disclosure includes a display panel 106, a data driver circuit 126, a gate driver circuit 128, and a timing controller 124.

A plurality of data lines 14 and a plurality of gate lines 15 are arranged to intersect each other and on the display panel 106. Further, sub-pixels SP are arranged in a matrix form and are respectively disposed at intersections between the data lines 14 and the gate lines 16.

The data lines 14 includes m data voltage supply lines 14A_1 to 14A_m (m being a positive integer) and m sensed voltage readout lines 14B_1 to 14B_m. Moreover, the gate lines 15 include n (n being positive integer) first gate lines 15A_1 to 15A_n and n second gate lines 15B_1 to 15B_n.

Each sub-pixel SP can be connected to one of the data voltage supply lines 14A_1 to 14A_m, one of the sensed voltage readout lines 14B_1 to 14B_m, one of the first gate lines 15A_1 to 15A_n, and one of the second gate lines 15B_1 to 15B_n. The sub-pixels SP can display different colors. A certain number of sub-pixel SPs can constitute one pixel P.

Each sub-pixel SP can receive a data voltage through the data voltage supply line, can receive a first gate signal through the first gate line, can receive a second gate signal through the second gate line, and can outputs a sensed voltage through the sensed voltage readout line.

That is, in the sub-pixel array shown in FIG. 2, the sub-pixels SP can operate on one horizontal line L #1 to L #n basis in response to the first gate signal supplied on a horizontal line basis from the first gate lines 15A_1 to 15A_n and the second gate signal supplied on a horizontal line basis from the second gate lines 15B_1 to 15B_n. Sub-pixels SP on the same horizontal line where a sensing operation is activated can receive a data voltage for sensing a threshold voltage from the data voltage supply lines 14A_1 to 14A_m and outputs a sensed voltage to the sensed voltage readout lines 14B_1 to 14B_m. Each of the first gate signal and the second gate signal can be a gate signal for sensing the threshold voltage or a gate signal for displaying an image, respectively. The present disclosure is not limited thereto.

Each sub-pixel SP can receive a high-potential voltage EVDD and a low-potential voltage EVSS from a power supply circuit. The sub-pixel SP can include an organic light emitting diode (OLED), a driving transistor, first and second switching transistors, and a storage capacitor. According to an embodiment, a light source other than the OLED can be included in the sub-pixel SP.

Each of the transistors constituting the sub-pixel SP can be implemented as a p-type or n-type transistor. Further, a semiconductor layer of each of the transistors constituting the sub-pixel SP can include amorphous silicon or polysilicon or an oxide.

During a sensing operation for sensing a threshold voltage of the driving transistor, the data driver circuit 126 can transmit a data voltage for sensing the threshold voltage to the sub-pixels SP, based on the first gate signal for sensing the threshold voltage supplied on a horizontal line basis and can convert a sensed voltage input from the display panel 106 via the sensed voltage readout lines 14B_1 to 14B_m into a digital value and can supply the converted digital value to the timing controller 124.

During the image display operation, the data driver circuit 126 converts compensated image data MDATA input from the timing controller 124 based on a data control signal DDC into a data voltage for image display and supplies the converted data voltage to the data voltage supply lines 14A_1 to 14A_m.

The gate driver circuit 128 generates the gate signal based on a gate control signal GDC. The gate signal can include the first gate signal for sensing the threshold voltage, the second gate signal for sensing the threshold voltage, a first gate signal for displaying an image, and a second gate signal for displaying an image.

During the sensing operation, the gate driver circuit 128 can supply the first gate signal for sensing the threshold voltage to the first gate lines 15A_1 to 15A_n on a horizontal line basis, and can supply the second gate signal for sensing the threshold voltage to the second gate lines 15B_1 to 15B_n on a horizontal line basis. During the image display operation for image display, the gate driver circuit 128 can supply the first gate signal to display the image to the first gate lines 15A_1 to 15A_n on a horizontal line basis, and can supply the second gate signal to display the image to the second gate lines 15B_1 to 15B_n on a horizontal line basis. In one embodiment of the present disclosure, the gate driver circuit 128 can be disposed on the display panel 106 in a GIP (Gate-driver In Panel) scheme.

The timing controller 124 can generate and output the data control signal DDC for controlling an operation timing of the data driver circuit 126 and the gate control signal GDC for controlling an operation timing of the gate driver circuit 128, based on timing signals such as a vertical synchronization signal Vsync, a horizontal synchronization signal Hsync, a dot clock signal DCLK, and a data enable signal DE. Further, the timing controller 124 compensates for image data DATA based on a sensed value supplied from the data driver circuit 126 to generate compensated image data MDATA for compensating for a threshold voltage deviation of the driving transistor, and supplies the compensated image data MDATA to the data driver circuit 126.

Figure 3:
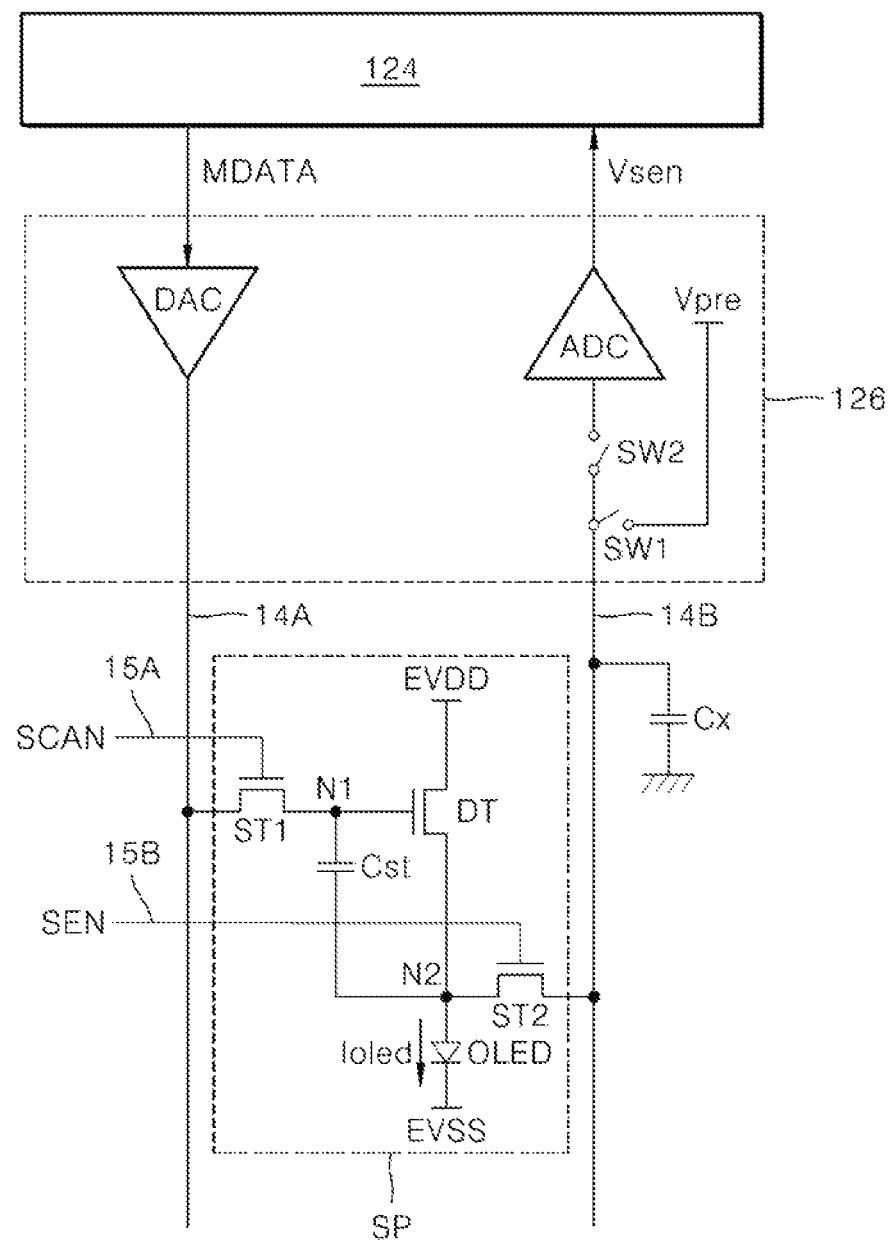
FIG. 3 shows a configuration of a sub-pixel circuit, and a connection structure between a timing controller, a data driver circuit, and a sub-pixel according to one embodiment of the present disclosure.

FIG. 3 shows a configuration of a sub-pixel circuit, and a connection structure between a timing controller, a data driver circuit, and a sub-pixel according to one embodiment of the present disclosure.

Referring to FIG. 3, the sub-pixel SP includes the OLED, the driving transistor DT, the storage capacitor Cst, the first switching transistor ST, and the second switching transistor ST2.

The OLED includes an anode connected to a second node N2, a cathode connected to an input side of a low-potential driving voltage EVSS, and an organic compound layer located between the anode and the cathode.

The driving transistor DT is turned on based on a gate-source voltage Vgs to control a current Ioled flowing through the OLED. The driving transistor DT includes a gate electrode connected to a first node N1, a drain electrode connected to an input side of a high-potential driving voltage EVDD, and a source electrode connected to the second node N2.

The storage capacitor Cst is connected to and disposed between the first node N1 and the second node N2.

The first switching transistor ST1 applies a data voltage Vdata for sensing a threshold voltage as charged in the data voltage supply line 14A to the first node N1 in response to the first gate signal SCAN for sensing the threshold voltage, during the sensing operation.

The first switching transistor ST1 applies a data voltage Vdata for displaying an image charged in the data voltage supply line 14A to the first node N1 in response to the first gate signal SCAN for displaying the image, during an image display operation. The first switching transistor ST1 includes a gate electrode connected to the first gate line 15A, a drain electrode connected to the data voltage supply line 14A, and a source electrode connected to the first node N1.

During the sensing operation, the second switching transistor ST2 switches a current flow between the second node N2 and the sensed voltage readout line 14B in response to the second gate signal SEN for sensing the threshold voltage such that a source voltage of the second node N2 which changes based on a gate voltage of the first node N1 is stored in a sensing capacitor Cx of the sensed voltage readout line 14B.

During the image display operation, the second switching transistor ST2 switches a current flow between the second node N2 and the sensed voltage readout line 14B in response to the second gate signal SEN for displaying the image to reset a source voltage of the driving transistor DT to an initialization voltage Vpre. The gate electrode of the second switching transistor ST2 can be connected to the second gate line 15B. The drain electrode of the second switching transistor ST2 can be connected to the second node N2. The source electrode of the second switching transistor ST2 can be connected to the sensed voltage readout line 14B.

The data driver circuit 126 is connected to the sub-pixel SP via the data voltage supply line 14A and the sensed voltage readout line 14B. The sensing capacitor Cx is connected to the sensed voltage readout line 14B to store therein a source voltage of the second node N2 as a sensed voltage Vsen. The data driver circuit 126 includes a digital-analog converter DAC, an analog-digital converter ADC, an initialization switch SW1, and a sampling switch SW2.

The DAC can generate the data voltage Vdata for sensing the threshold voltage at the same level or different levels for first and second periods of a sensing period under control of the timing controller 124 and output the generated data voltage to the data voltage supply line 14A. The DAC can convert the compensated image data MDATA to a data voltage Vdata for image display under control of the timing controller 124 for the image display period and output the converted data voltage to the data voltage supply line 14A.

The initialization switch SW1 switches current flow between an input side of the initialization voltage Vpre and the sensed voltage readout line 14B. The sampling switch SW2 switches current flow between the sensed voltage readout line 14B and the ADC. The ADC can convert an analog sensed voltage Vsen stored in the sensing capacitor Cx into a digital value and can supply the digital sensed value to the timing controller 124.

A sensing operation process performed under control of the timing controller 124 is as follows. For the sensing operation, when the first and second gate signals SCAN and SEN for sensing the threshold voltage are applied to the sub-pixel SP while being at an on level Lon, the first switching transistor ST1 and the second switching transistor ST2 are turned on. In this connection, the initialization switch SW1 in the data driver circuit 126 is turned on.

When the first switching transistor ST1 is turned on, the data voltage Vdata for sensing the threshold voltage is supplied to the first node N1. When the initialization switch SW1 and the second switching transistor ST2 are turned on, the initialization voltage Vpre is supplied to the second node N2. In this connection, the voltage Vgs between a gate and a source of the driving transistor DT becomes larger than a threshold voltage Vth, such that a current Ioled flows between the drain and the source of the driving transistor DT. A source voltage VN2 of the driving transistor DT charged in the second node N2 can gradually increase due to this current Ioled. Thus, the source voltage VN2 of the driving transistor DT can follow a gate voltage VN1 of the driving transistor DT until the gate-source voltage Vgs of the driving transistor DT becomes the threshold voltage Vth.

The source voltage VN2 of the driving transistor DT charged in the second node N2 in the increasing manner is stored as the sensed voltage Vsen in the sensing capacitor Cx formed in the sensed voltage readout line 14B via the second switching transistor ST2. The sensed voltage Vsen can be detected when the sampling switch SW2 in the data driver circuit 126 is turned on within the sensing period for which the second gate signal SEN for sensing the threshold voltage is maintained at the on level, and then the sensed voltage Vsen as detected can be supplied to the ADC.

In one embodiment of the present disclosure, the timing controller 124 can control the data driver circuit 126 and the gate driver circuit 128 so that one frame of the image data is displayed during the image display operation and then the sensing operation is performed on one horizontal line before a next frame thereof is displayed.

Figure 4:
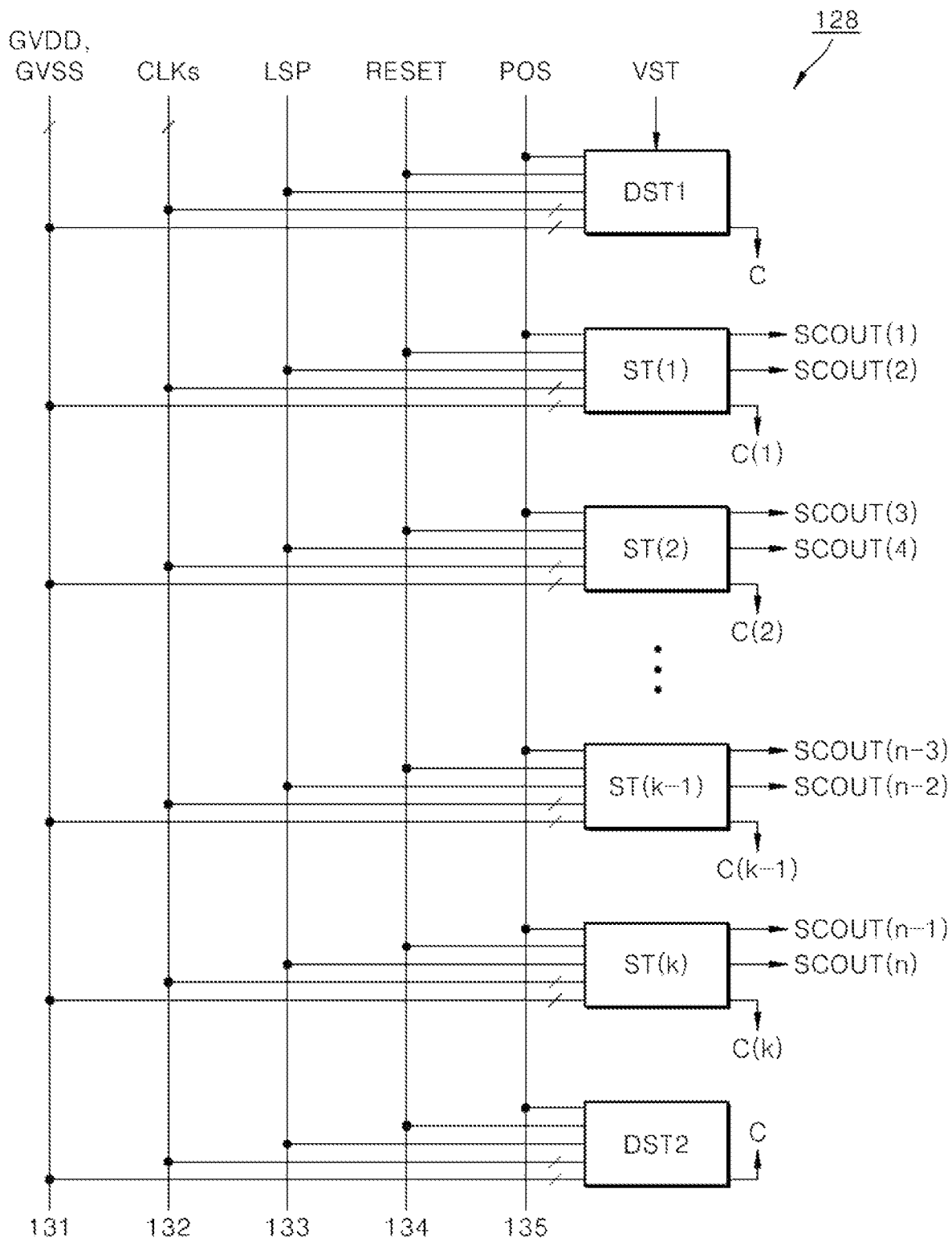
FIG. 4 shows a configuration of a plurality of stage circuits included in a gate driver circuit according to one embodiment of the present disclosure.

FIG. 4 shows a configuration of a plurality of stage circuits included in the gate driver circuit according to one embodiment of the present disclosure.

Referring to FIG. 4, the gate driver circuit 128 according to one embodiment of the present disclosure includes first to k-th stage circuits ST(1) to ST(k) (k is a positive integer), a gate driving voltage line 131, a clock signal line 132, a line sensing preparation signal line 133, and a reset signal line 134, and a panel on signal line 135. Further, the gate driver circuit 128 can further include a front dummy stage circuit DST1 disposed in front of the first stage circuit ST(1) and a rear dummy stage circuit DST2 disposed in rear of the k-th stage circuit ST(k).

The gate driving voltage line 131 can supply a high-potential voltage GVDD and a low-potential voltage GVSS supplied from a power supply circuit to each of the first to k-th stage circuits ST(1) to ST(k), the front dummy stage circuit DST1, and the rear dummy stage circuit DST2.

In one embodiment of the present disclosure, the gate driving voltage line 131 can include a plurality of high-potential voltage lines for supplying a plurality of high-potential voltages having different voltage levels, respectively, and a plurality of low-potential voltage lines for supplying a plurality of low-potential voltages having different voltage levels, respectively.

In one example, the gate driving voltage line 131 has two high-potential voltage lines for supplying a first high-potential voltage GVDD1 and a second high-potential voltage GVDD2 having different voltage levels, respectively. The gate driving voltage line 131 has four low-potential voltage lines for supplying a first low-potential voltage GVSS1, a second low-potential voltage GVSS2, a third low-potential voltage GVSS3, and a fourth low-potential voltage GVSS4 having different voltage levels, respectively. However, this is only one example. The number of the voltage lines included in the gate driving voltage line 131 can vary based on embodiments.

The clock signal line 132 can supply a plurality of clock signals CLKs supplied from the timing controller 124, for example, a carry clock signal CRCLK or a scan clock signal SCCLK to each of the first to k-th stage circuits ST(1) to ST(k), the front dummy stage circuit DST1 and the rear dummy stage circuit DST2.

The line sensing preparation signal line 133 can supply a line sensing preparation signal LSP supplied from the timing controller 124 to the first to k-th stage circuits ST(1) to ST(k). Optionally, the line sensing preparation signal line 133 can be further connected to the front dummy stage circuit DST1.

The reset signal line 134 can supply a reset signal RESET supplied from the timing controller 124 to each of the first to k-th stage circuits ST(1) to ST(k), the front dummy stage circuit DST1, and the rear dummy stage circuit DST2.

The panel on signal line 135 can supply a panel on signal POS supplied from the timing controller 124 to each of the first to k-th stage circuits ST(1) to ST(k), the front dummy stage circuit DST1, and the rear dummy stage circuit DST2.

In addition, lines for supplying signals other than the lines 131, 132, 133, 134, and 135 as shown in FIG. 4 can be additionally connected to the first to k-th stage circuits ST(1) to ST(k), the front dummy stage circuit DST1, and the rear dummy stage circuit DST2. In one example, a line for supplying a gate start signal VST to the front dummy stage circuit DST1 can be additionally connected to the front dummy stage circuit DST1.

The front dummy stage circuit DST1 outputs a front carry signal C in response to an input of the gate start signal VST supplied from the timing controller 124. The front carry signal C can be supplied to one of the first to k-th stage circuits ST(1) to ST(k).

The rear dummy stage circuit DST2 outputs a rear carry signal C. The rear carry signal C can be supplied to one of the first to k-th stage circuits ST(1) to ST(k).

The first to k-th stage circuits ST(1) to ST(k) can be connected to each other in a cascaded manner or in a stepped manner.

In the embodiment shown in FIG. 4, each stage circuit outputs two gate signals SCOUT and one carry signal C. For example, a first stage circuit ST(1) outputs a first gate signal SCOUT(1), a second gate signal SCOUT(2), and a first carry signal C(1). A second stage circuit ST(2) outputs a third gate signal SCOUT(3), a fourth gate signal SCOUT(4), and a second carry signal C(2).

The number of gate signals output from the first to k-th stage circuits ST(1) to ST(k) is equal to the number n of the gate lines 15 arranged in the display panel 106. Therefore, in the embodiment shown in FIG. 4, the number k of the first to k-th stage circuits ST(1) to ST(k) is ½ of the number n of the gate lines 15. That is, in the embodiment of FIG. 4, k=n/2.

However, the number of the gate signals output from each stage circuit is not limited thereto. That is, in another embodiment of the present disclosure, each stage circuit can be designed to output one gate signal or three or more gate signals. The number of stage circuits can vary based on the number of the gate signals output from each stage circuit. For example, when the number of the gate lines 15 is n, and each stage circuit outputs one gate signal, the gate driver circuit 128 includes n stage circuits. In still another example, when the number of the gate lines 15 included in the display panel 106 is n, and each stage circuit outputs 4 gate signals, the gate driver circuit 128 includes n/4 stage circuits.

Hereinafter, an embodiment in which each stage circuit outputs two gate signals SCOUT and one carry signal C as shown in FIG. 4 is described. However, the present disclosure is not limited to this embodiment.

Each of the gate signals SCOUT output from the first to k-th stage circuits ST(1) to ST(k) can act as the gate signal for sensing the threshold voltage or the gate signal for displaying the image. Further, each carry signal C output from each of the first to k-th stage circuits ST(1) to ST(k) can be supplied to a stage circuit other than each stage circuit. In accordance with the present disclosure, a carry signal which one stage circuit receives from the front stage circuit can be referred to as the front carry signal, while a carry signal which one stage circuit receives from the rear stage circuit can be referred to as the rear carry signal.

Figure 5:
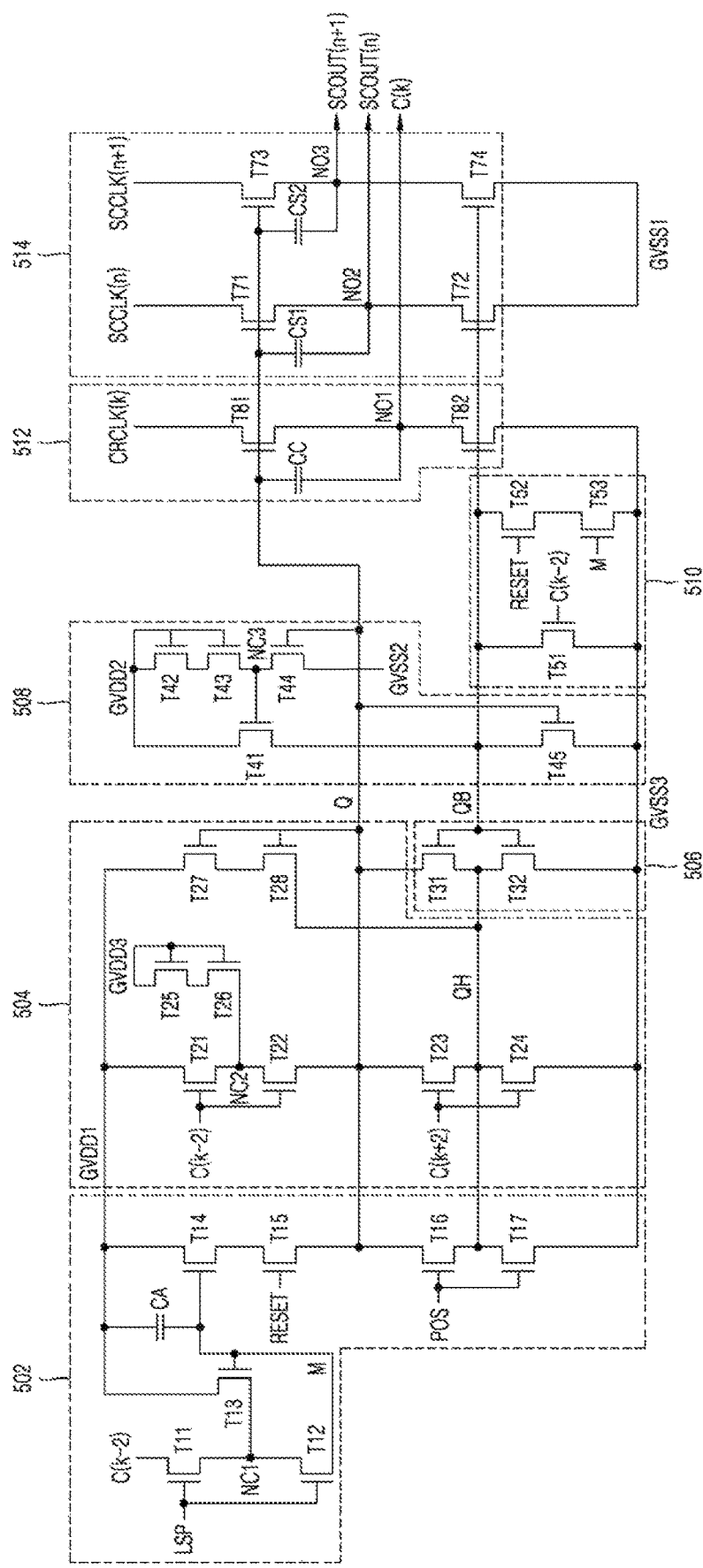
FIG. 5 is a circuit diagram of a stage circuit according to one embodiment of the present disclosure.

FIG. 5 is a circuit diagram of a stage circuit according to one embodiment of the present disclosure.

The stage circuit shown in FIG. 5 can be one stage circuit among the first to k-th stage circuits ST(1) to ST(k) shown in FIG. 4.

Referring to FIG. 5, the stage circuit according to one embodiment of the present disclosure includes an M node, a Q node, a QH node, and a QB node. Further, the stage circuit according to one embodiment of the present disclosure includes a line selector 502, a Q node controller 504, a Q node and QH node stabilizer 506, an inverter 508, a QB node stabilizer 510, a carry signal output module 512 (e.g., a carry signal output circuit portion), and a gate signal output module 514 (e.g., a gate signal output circuit portion).

The line selector 502 charges the M node based on the front carry signal C(k−2) in response to an input of the line sensing preparation signal LSP. Further, the line selector 502 charges the Q node to a first high-potential voltage GVDD1 level based on a charged voltage of the M node in response to an input of the reset signal RESET. Further, the line selector 502 discharges or resets the Q node to a third low-potential voltage GVSS3 level in response to an input of the panel on signal POS.

The line selector 502 includes first to seventh transistors T11 to T17 and a pre-charging capacitor CA.

The first transistor T11 and the second transistor T12 are connected to and disposed between a first high-potential voltage line for delivering the first high-potential voltage GVDD1 and the M node. Further, the first transistor T11 and the second transistor T12 are connected in series with each other.

The first transistor T11 outputs a front carry signal C(k−2) to a first connection node NC1 in response to an input of the line sensing preparation signal LSP. The second transistor T12 electrically connects the first connection node NC1 to the M node in response to an input of the line sensing preparation signal LSP. For example, when the line sensing preparation signal LSP having a high level voltage is input to the first transistor T11 and the second transistor T12, the first transistor T11 and the second transistor T12 are simultaneously turned on to charge the M node to the first high-potential voltage GVDD1 level.

A third transistor T13 can be turned on when a voltage level of the M node is at a high level, and thus can supply the first high-potential voltage GVDD1 to the first connection node NC1. When the first high-potential voltage GVDD1 is supplied to the first connection node NC1, a difference between a gate voltage of the first transistor T11 and a voltage of the first connection node NC1 increases. Therefore, when the line sensing preparation signal LSP of a low level voltage is input to a gate of the first transistor T11 such that the first transistor T11 is turned off, the first transistor T11 can be maintained in a completely turned off state due to the difference between the gate voltage of the first transistor T11 and the voltage of the first connection node NC1. Accordingly, current leakage of the first transistor T11 is prevented and thus, voltage drop of the M node can be prevented, so that the voltage of the M node can be stably maintained.

The pre-charging capacitor CA is connected to and disposed between the first high-potential voltage line for delivering the first high-potential voltage GVDD1 and the M node, and stores therein a voltage corresponding to a difference between the first high-potential voltage GVDD1 and a voltage charged to the M node. When the first transistor T11, the second transistor T12, and the third transistor T13 are turned on, the pre-charging capacitor CA stores therein a high level voltage of the front carry signal C(k−2). When the first transistor T11, the second transistor T12, and the third transistor T13 are turned off, the pre-charging capacitor CA maintains the voltage of the M node using the voltage stored therein for a certain period of time.

A fourth transistor T14 and a fifth transistor T15 are connected to and disposed between the Q node and the first high-potential voltage line for delivering the first high-potential voltage GVDD1. The fourth transistor T14 and the fifth transistor T15 are connected in series with each other.

The fourth transistor T14 and the fifth transistor T15 charge the Q node to the first high-potential voltage GVDD1 in response to the voltage of the M node and an input of the reset signal RESET. The fourth transistor T14 can be turned on when the voltage of the M node is at a high level, and thus can transmit the first high-potential voltage GVDD1 to a shared node between the fourth transistor T14 and the fifth transistor T15. The fifth transistor T15 can be turned on based on a high level reset signal RESET to supply the voltage of the shared node to the Q node. Therefore, when the fourth transistor T14 and the fifth transistor T15 are simultaneously turned on, the Q node is charged with the first high-potential voltage GVDD1.

A sixth transistor T16 and a seventh transistor T17 are connected to and disposed between the Q node and a third low-potential voltage line that can transmit the third low-potential voltage GVSS3. The sixth transistor T16 and the seventh transistor T17 are connected in series to each other.

The sixth transistor T16 and the seventh transistor T17 discharge the Q node to the third low-potential voltage GVSS3 in response to an input of the panel on signal POS. The Q node being discharged to the third low-potential voltage GVSS3 can also be referred to as the Q node being reset. The seventh transistor T17 can be turned on based on an input of a high level panel on signal POS to supply the third low-potential voltage GVSS3 to the QH node. The sixth transistor T16 is turned on according to an input of the high level panel-on signal POS to electrically connect the Q node and the QH node to each other. Therefore, when the sixth transistor T16 and the seventh transistor T17 are simultaneously turned on, the Q node is discharged or reset to the third low-potential voltage GVSS3.

The Q node controller 504 charges the Q node to the first high-potential voltage GVDD1 level, in response to an input of the front carry signal C(k−2), and discharges the Q node to the third low-potential voltage GVSS3 level, in response to an input of the rear carry signal C(k+2).

The Q node controller 504 includes first to eighth transistors T21 to T28.

The first transistor T21 and the second transistor T22 are connected to and disposed between the Q node and the first high-potential voltage line for delivering the first high-potential voltage GVDD1. The first transistor T21 and the second transistor T22 are connected in series with each other.

The first transistor T21 and the second transistor T22 charge the Q node to the first high-potential voltage GVDD1 level in response to an input of the front carry signal C(k−2). The first transistor T21 can be turned on according to an input of the front carry signal C(k−2) and thus can supply the first high-potential voltage GVDD1 to the second connection node NC2. The second transistor T22 can be turned on according to an input of the front carry signal C(k−2) and can electrically connect the second connection node NC2 and the Q node to each other. Therefore, when the first transistor T21 and the second transistor T22 are simultaneously turned on, the first high-potential voltage GVDD1 is supplied to the Q node.

A fifth transistor T25 and a sixth transistor T26 are connected to the third high-potential voltage line for delivering the third high-potential voltage GVDD3. The fifth transistor T25 and the sixth transistor T26 supply the third high-potential voltage GVDD3 to a second connection node NC2 in response to the third high-potential voltage GVDD3.

The fifth transistor T25 and the sixth transistor T26 are turned on at the same time based on the third high-potential voltage GVDD3, such that the third high-potential voltage GVDD3 is constantly supplied to the second connection node NC2, thereby increasing a difference between the gate voltage of the first transistor T21 and a voltage of the second connection node NC2. Therefore, when a low level front carry signal C(k−2) is input to the gate of the first transistor T21 and thus, the first transistor T21 is turned off, the first transistor T21 can be maintained in a completely turned-off state due to the difference between the gate voltage of the first transistor T21 and the voltage of the second connection node NC2. Accordingly, the current leakage of the first transistor T21 and thus, the voltage drop of the Q node can be prevented, so that the voltage of the Q node can be stably maintained.

In one example, when a threshold voltage of the first transistor T21 is negative (−), the gate-source voltage Vgs of the first transistor T21 is maintained to be negative (−) due to the third high-potential voltage GVDD3 supplied to the drain electrode. Therefore, when the low level front carry signal C(k−2) is input to the gate of the first transistor T21 and thus the first transistor T21 is turned off, the first transistor T21 can be maintained in a completely turned off state to prevent the leakage current therefrom.

In one embodiment of the present disclosure, the third high-potential voltage GVDD3 is set to a lower voltage level than that of the first high-potential voltage GVDD1.

A third transistor T23 and a fourth transistor T24 are connected to and disposed between the Q node and the third low-potential voltage line for delivering the third low-potential voltage GVSS3. The third transistor T23 and the fourth transistor T24 are connected in series with each other.

The third transistor T23 and the fourth transistor T24 discharge the Q node and the QH node to the third low-potential voltage GVSS3 level in response to an input of the rear carry signal C(k+2). The fourth transistor T24 is turned on according to an input of the rear carry signal C(k+2) to discharge the QH node to the third low-potential voltage GVSS3 level. The third transistor T23 is turned on according to an input of the rear carry signal C(k+2) to electrically connect the Q node and the QH node to each other. Therefore, when the third transistor T23 and the fourth transistor T24 are simultaneously turned on, each of the Q node and the QH node is discharged or reset to the third low-potential voltage GVSS3 level.

A seventh transistor T27 and an eighth transistor T28 are connected to and disposed between the first high-potential voltage line for delivering the first high-potential voltage GVDD1 and the Q node, and are connected to and disposed between the first high-potential voltage line for delivering the first high-potential voltage GVDD1 and the QH node. The seventh transistor T27 and the eighth transistor T28 are connected in series with each other.

The seventh transistor T27 and the eighth transistor T28 supply the first high-potential voltage GVDD1 to the QH node in response to the voltage of the Q node. The seventh transistor T27 can be turned on when the voltage of the Q node is at a high level and thus can supply the first high-potential voltage GVDD1 to a shared node between the seventh transistor T27 and the eighth transistor T28. The eighth transistor T28 can be turned on when the voltage of the Q node is at a high level and thus can electrically connect the shared node and the QH node to each other. Therefore, the seventh transistor T27 and the eighth transistor T28 are simultaneously turned on when the voltage of the Q node is at a high level, such that the first high-potential voltage GVDD1 is supplied to the QH node.

When the first high-potential voltage GVDD1 is supplied to the QH node, a difference between the gate voltage of the third transistor T23 and the voltage of the QH node increases. Therefore, when the low level rear carry signal C(k+2) is input to the gate of the third transistor T23 and thus the third transistor T23 is turned off, the third transistor T23 can be maintained in a completely turned off state due to the difference between the gate voltage of the third transistor T23 and the voltage of the QH node. Accordingly, current leakage of the third transistor T23 is prevented and thus, the voltage drop of the Q node can be prevented, so that the voltage of the Q node can be stably maintained.

The Q node and QH node stabilizer 506 discharges the Q node and the QH node to the third low-potential voltage GVSS3 level in response to the voltage of the QB node.

The Q node and QH node stabilizer 506 includes a first transistor T31 and a second transistor T32. The first transistor T31 and the second transistor T32 are connected to and disposed between the Q node and the third low-potential voltage line for delivering the third low-potential voltage GVSS3. The first transistor T31 and the second transistor T32 are connected in series with each other.

The first transistor T31 and the second transistor T32 discharge the Q node and the QH node to the third low-potential voltage GVSS3 level in response to the voltage of the QB node. The second transistor T32 can be turned on when the voltage of the QB node is at a high level and thus can supply the third low-potential voltage GVSS3 to a shared node between the first transistor T31 and the second transistor T32. The first transistor T31 can be turned on when the voltage of the QB node is at a high level and thus can electrically connect the Q node and the QH node to each other. Therefore, when the first transistor T31 and the second transistor T32 are turned on simultaneously in response to the voltage of the QB node, each of the Q node and the QH node can be discharged or reset to the third low-potential voltage GVSS3 level.

The inverter 508 changes a voltage level of the QB node according to a voltage level of the Q node.

The inverter 508 includes first to fifth transistors T41 to T45.

A second transistor T42 and a third transistor T43 are connected to and disposed between a second high-potential voltage line for delivering the second high-potential voltage GVDD2 and a third connection node NC3. The second transistor T42 and the third transistor T43 are connected in series with each other.

The second transistor T42 and the third transistor T43 supply the second high-potential voltage GVDD2 to the third connection node NC3 in response to the second high-potential voltage GVDD2. The second transistor T42 is turned on based on the second high-potential voltage GVDD2 to supply the second high-potential voltage GVDD2 to a shared node between the second transistor T42 and the third transistor T43. The third transistor T43 is turned on based on the second high-potential voltage GVDD2 to electrically connect the shared node between the second transistor T42 and the third transistor T43 to the third connection node NC3. Therefore, when the second transistor T42 and the third transistor T43 are simultaneously turned on based on the second high-potential voltage GVDD2, the third connection node NC3 is charged to the second high-potential voltage GVDD2 level.

The fourth transistor T44 is connected to and disposed between the third connection node NC3 and the second low-potential voltage line for delivering the second low-potential voltage GVSS2.

The fourth transistor T44 can supply the second low-potential voltage GVSS2 to the third connection node NC3 in response to a voltage of the Q node. The fourth transistor T44 can be turned on when the voltage of the Q node is at a high level and thus can discharge or reset the third connection node NC3 to the second low-potential voltage GVSS2.

The first transistor T41 is connected to and disposed between the second high-potential voltage line for delivering the second high-potential voltage GVDD2 and the QB node.

The first transistor T41 can supply the second high-potential voltage GVDD2 to the QB node in response to a voltage of the third connection node NC3.

The first transistor T41 can be turned on when the voltage of the third connection node NC3 is at a high level and thus can charge the QB node to the second high-potential voltage GVDD2 level.

The fifth transistor T45 is connected to and disposed between the QB node and the third low-potential voltage line for delivering the third low-potential voltage GVSS3.

The fifth transistor T45 can supply the third low-potential voltage GVSS3 to the QB node in response to a voltage of the Q node. The fifth transistor T45 can be turned on when the voltage of the Q node is at a high level and thus can discharge or reset the QB node to the third low-potential voltage GVSS3 level.

The QB node stabilizer 510 discharges the QB node to the third low-potential voltage GVSS3 level in response to an input of the front carry signal C(k−2), to an input of the reset signal, and to a charged voltage of the M node.

The QB node stabilizer 510 includes first to third transistor T51 to T53.

The first transistor T51 is connected to and disposed between the QB node and the second low-potential voltage line for delivering the third low-potential voltage GVSS3.

The first transistor T51 can supply a third low-potential voltage GVSS3 to the QB node in response to an input of the front carry signal C(k−2). The fifth transistor T45 can be turned on when the voltage of the Q node is at a high level and thus can discharge or reset the QB node to the third low-potential voltage GVSS3 level.

The second transistor T52 and the third transistor T53 are connected to and disposed between the QB node and the third low-potential voltage line for delivering the third low-potential voltage GVSS3. The second transistor T52 and the third transistor T53 are connected in series with each other.

The second transistor T52 and the third transistor T53 discharge the QB node to the third low-potential voltage GVSS3 level in response to an input of the reset signal and a charged voltage of the M node. The third transistor T53 can be turned on when the voltage of the M node is at a high level and thus can supply the third low-potential voltage GVSS3 to a shared node between the second transistor T52 and the third transistor T53. The second transistor T52 can be turned on based on an input of the reset signal RESET, such that the shared node between the second transistor T52 and the third transistor T53 is electrically connected to the QB node. Therefore, when the reset signal RESET is input to the second transistor T52 and the third transistor T53 while the voltage of the M node is at a high level, the second transistor T52 and the third transistor T53 are turned on at the same time to discharge or reset the QB node to the third low-potential voltage GVSS2 level.

The carry signal output module 512 outputs the carry signal C(k) based on a voltage level of the carry clock signal CRCLK(k) or the third low-potential voltage GVSS3 level, according to a voltage level of the Q node or a voltage level of the QB node.

The carry signal output module 512 includes a first transistor T81, a second transistor T82, and a boosting capacitor CC.

The first transistor T81 is connected to and disposed between a clock signal line for delivering the carry clock signal CRCLK(k) and the QB node. The boosting capacitor CC is connected to and disposed between a gate and a source of the first transistor T81.

The first transistor T81 outputs a high level voltage carry signal C(k) through the first output node NO1, based on the carry clock signal CRCLK(k), in response to a voltage of the Q node. The first transistor T81 can be turned on when the voltage of the Q node is at a high level and thus can supply the carry clock signal CRCLK(k) having a high level voltage to the first output node NO1. Accordingly, the high level voltage carry signal C(k) is output.

When the carry signal C(k) is output, the boosting capacitor CC bootstraps a voltage of the Q node to a boosting voltage level higher than the first high-potential voltage GVDD1 level while being in synchronization with the carry clock signal CRCLK(k) having a high level voltage level. When the voltage of the Q node is bootstrapped, the high voltage level carry clock signal CRCLK(k) can be output as the carry signal C(k) quickly and without distortion.

The second transistor T82 is connected to and disposed between the first output node NO1 and the third low-potential voltage line for delivering the third low-potential voltage GVSS3.

The second transistor T82 outputs a low level voltage carry signal C(k) through the first output node NO1, based on the third low-potential voltage GVSS3, in response to a voltage of the QB node. The second transistor T82 can be turned on when the voltage of the QB node is at a high level and thus can supply the third low-potential voltage GVSS3 to the first output node NO1. Accordingly, the low level voltage carry signal C(k) is output.

The gate signal output module 514 can operate based on a voltage level of the Q node or a voltage level of the QB node to output gate signals SCOUT(n) and SCOUT(n+1), based on voltage levels of scan clock signals SCCLK(n) and SCCLK(n+1) or the first low-potential voltage GVSS1 level.

The gate signal output module 514 includes first to fourth transistors T71 to T74, and boosting capacitors CS1 and CS2.

The first transistor T71 is connected to and disposed between the QB node and the clock signal line that transmits the scan clock signal SCCLK(n). The boosting capacitor CS1 is connected to and disposed between a gate and a source of the first transistor T71.

The first transistor T71 operates in response to the voltage of the Q node to output a gate signal SCOUT(n) having a high level voltage based on the scan clock signal SCCLK(n) through a second output node NO2. The first transistor T71 is turned on when the voltage of the Q node is at a high voltage level and thus supplies the scan clock signal SCCLK(n) having a high level voltage to the second output node NO2. Accordingly, the gate signal SCOUT(n) having a high level voltage is output.

When the gate signal SCOUT(n) is output, the boosting capacitor CS1 bootstraps the voltage of the Q node to a boosting voltage level higher than the first high-potential voltage GVDD1 level in a synchronized manner with the high voltage level scan clock signal SCCLK(n). When the voltage of the Q node is bootstrapped, the high voltage level scan clock signal SCCLK(n) can be output as the gate signal SCOUT(n) quickly and without distortion.

The second transistor T72 operates in response to the voltage of the QB node to output a gate signal SCOUT(n) having a low level voltage based on the first low-potential voltage GVSS1 through the second output node NO2. The second transistor T72 is turned on when the voltage of the QB node is at a high voltage level and thus supplies the first low-potential voltage GVSS1 to the second output node NO2. Accordingly, the gate signal SCOUT(n) having A low level voltage is output.

The third transistor T73 is connected to and disposed between the QB node and the clock signal line that transmits the scan clock signal SCCLK(n+1). The boosting capacitor CS2 is connected to and disposed between a gate and a source of the third transistor T73.

The third transistor T73 operates in response to the voltage of the Q node to output a gate signal SCOUT(n+1) having a high level voltage based on the scan clock signal SCCLK(n+1) through a third output node NO3. The third transistor T73 is turned on when the voltage of the Q node is at a high voltage level and thus supplies the scan clock signal SCCLK(n+1) having a high level voltage to the third output node NO3. Accordingly, the gate signal SCOUT(n+1) having a high level voltage is output.

When the gate signal SCOUT(n+1) is output, the boosting capacitor CS2 bootstraps the voltage of the Q node to a voltage level higher than the first high-potential voltage GVDD1 level in a synchronized manner with the high voltage level scan clock signal SCCLK(n+1). When the voltage of the Q node is bootstrapped, the high voltage level scan clock signal SCCLK(n+1) can be output as the gate signal SCOUT(n+1) quickly and without distortion.

The fourth transistor T74 operates in response to the voltage of the QB node to output a gate signal SCOUT(n+1) of a low level voltage based on the first low-potential voltage GVSS1 through the third output node N03. The fourth transistor T74 is turned on when the voltage of the QB node is at a high voltage level and thus supplies the first low-potential voltage GVSS1 to the third output node NO3. Accordingly, the gate signal SCOUT(n+1) having a low level voltage is output.

In the embodiment shown in FIG. 5, each stage circuit receives the three high-potential voltages GVDD1, GVDD2, and GVDD3 set to different levels and the three low-potential voltages GVSS1, GVSS2, and GVSS3 set to different levels. For example, the first high-potential voltage GVDD1 can be set to 20V, the second high-potential voltage GVDD2 can be set to 16V, and the third high-potential voltage GVDD3 can be set to 14V. The first low-potential voltage GVSS1 can be set to −6V, the second low-potential voltage GVSS2 can be set to −10V, and the third low-potential voltage GVSS3 can be set to −12V. In still another example, the first low-potential voltage GVSS1 and the second low-potential voltage GVSS2 can be set to the same voltage level, for example, −6V. These numerical values are just one example. The levels of the high-potential voltages and the low-potential voltages can vary based on embodiments.

Hereinafter, a process in which the stage circuit having the configuration as shown in FIG. 5 outputs a gate signal for image display and a gate signal for sensing will be described with reference to FIG. 6 and FIG. 7.

Figure 6:
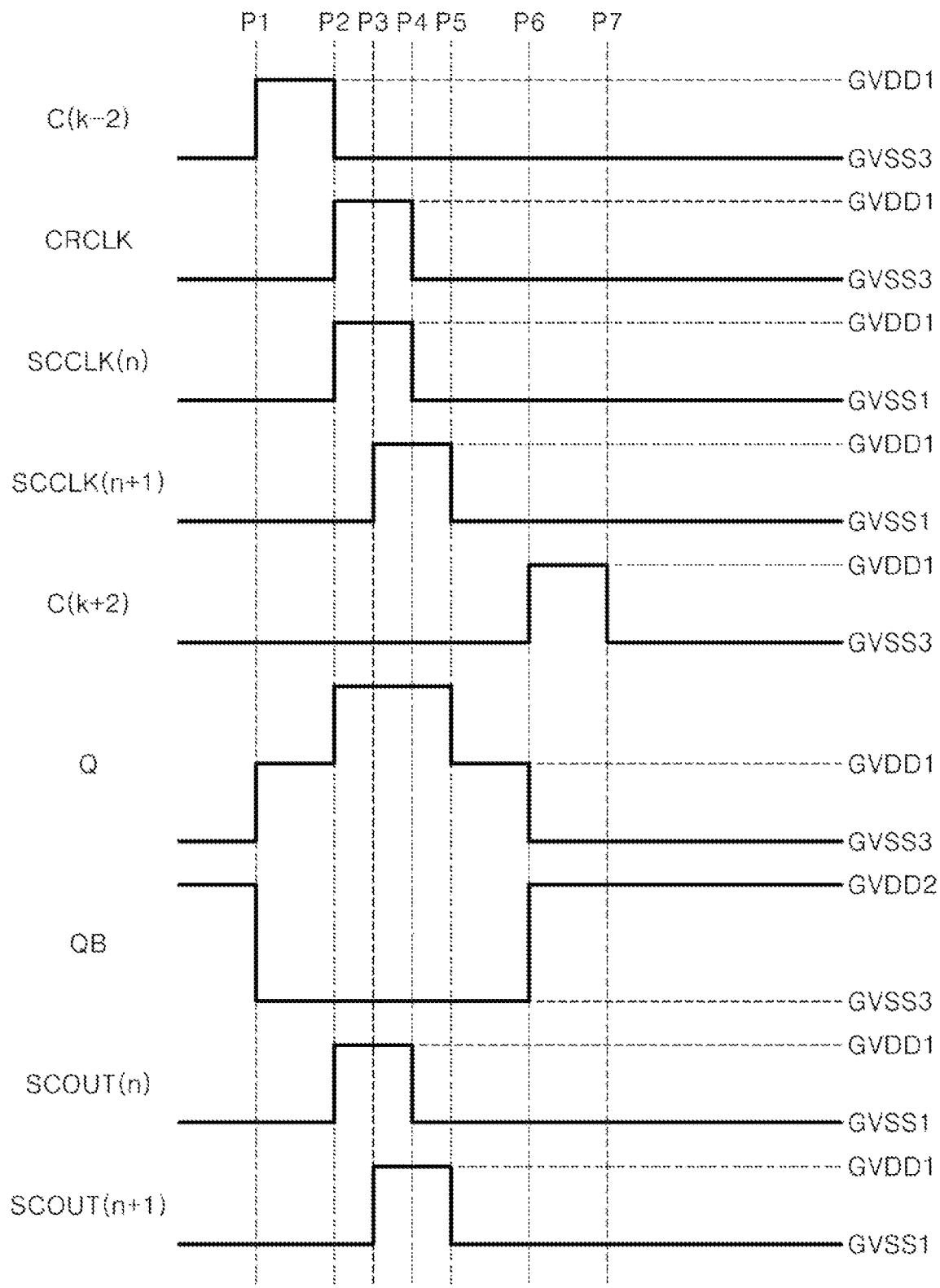
FIG. 6 shows a waveform of each of an input signal and an output signal when the stage circuit of FIG. 5 outputs a gate signal for image display according to one embodiment of the present disclosure.

FIG. 6 shows a waveform of each of an input signal and an output signal when the stage circuit of FIG. 5 outputs a gate signal for image display.

When a high voltage level front carry signal C(k−2) is input to the stage circuit for a period P1 to P2, the first transistor T21 and the second transistor T22 of the Q node controller 504 are turned on. Accordingly, the Q node is charged to the first high-potential voltage GVDD1 level. Further, the first transistor T51 of the QB node stabilizer 510 is turned on based on the high voltage level front carry signal C(k−2), such that the QB node is discharged to the third low-potential voltage GVSS3 level.

When a high voltage level scan clock signal SCCLK(n) together with a high voltage level carry clock signal CRCLK (k) are input to the stage circuit for a period P2 to P3, the boosting capacitor CS1 bootstraps the voltage of the Q node to a boosting voltage level higher than the first high-potential voltage GVDD1. Accordingly, for the period P2 to P3, a gate signal SCOUT(n) for image display of a n-th line is output from the stage circuit.

Further, when a high voltage level scan clock signal SCCLK(n+1) is input to the stage circuit for a period P3 to P4 partially overlapping the period P2 to P3, the boosting capacitor CS2 bootstraps the Q node voltage to a boosting voltage level higher than the first high-potential voltage GVDD1 level. Accordingly, for the period P3 to P4, a gate signal SCOUT(n+1) for image display of a (n+1)-th line is output from the stage circuit.

Since a scan clock signal is not input to the stage circuit for a period P5 to P6, the voltage of the Q node is charged back to the first high-potential voltage GVDD1 level.

For a period P1 to P6 when the Q node is charged to the first high-potential voltage GVDD1 level or the boosting voltage level (e.g., the higher level above GVDD1 in FIG. 6), and the voltage of the QB node is maintained at the third low-potential voltage GVSS3 level during this period (e.g., P1 to P6).

When a high voltage level rear carry signal C(k+2) is input to the stage circuit for a period P6 to P7, the third transistor T23 and the fourth transistor T24 of the Q node controller 504 are turned on. Accordingly, the Q node is discharged to the third low-potential voltage GVSS3 level. When the Q node is discharged to the third low-potential voltage GVSS3 level, the fourth transistor T44 included in the inverter 508 is turned off. The second high-potential voltage GVDD2 is input to a gate of the first transistor T41, such that the first transistor T41 is turned on. When the first transistor T41 is turned on, the QB node is charged to the second high-potential voltage GVDD2 level.

Figure 7:
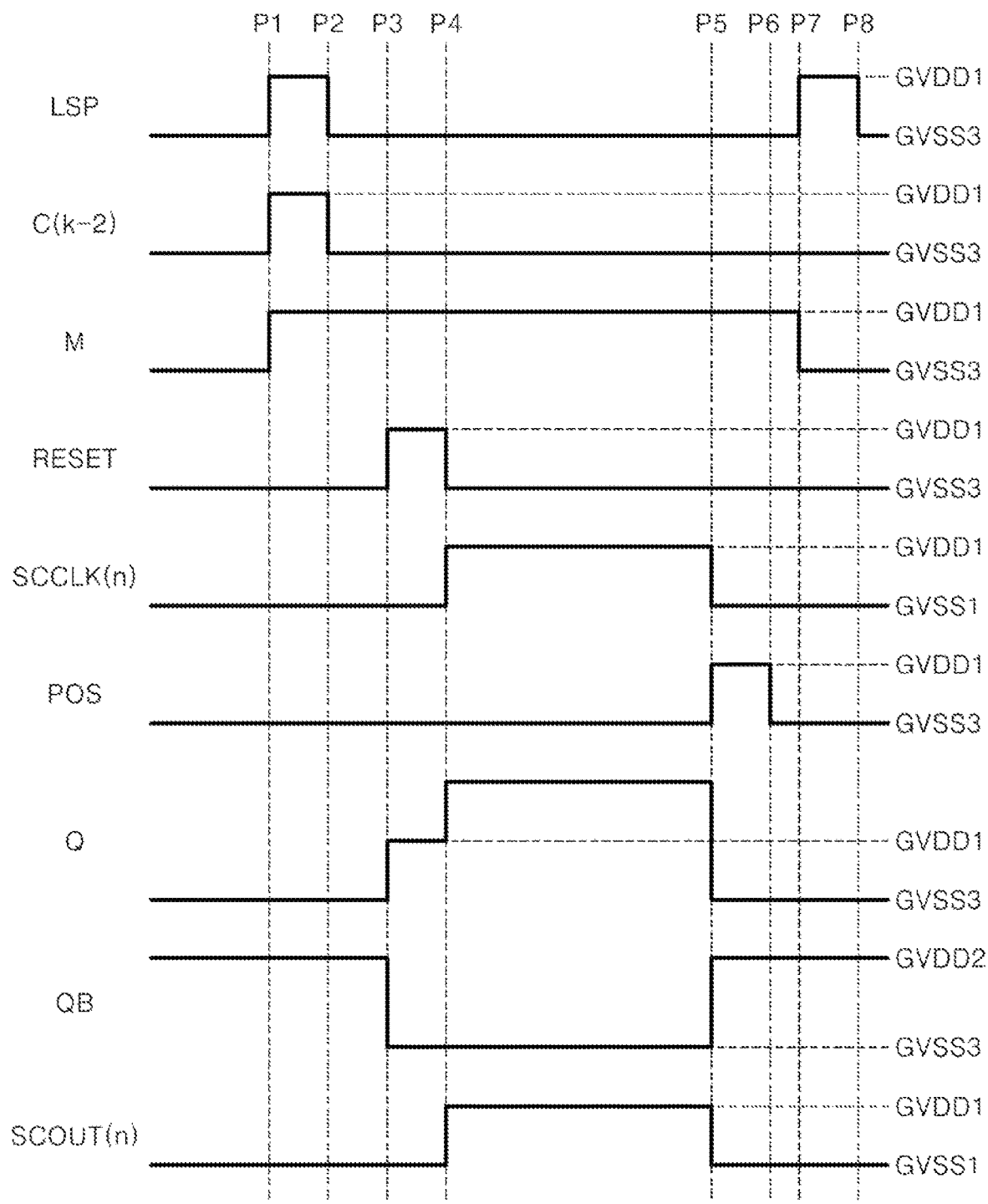
FIG. 7 shows a waveform of each of an input signal and an output signal when the stage circuit of FIG. 5 outputs a gate signal for sensing according to one embodiment of the present disclosure.

FIG. 7 shows an waveform of each of an input signal and an output signal when the stage circuit of FIG. 5 outputs a gate signal for sensing.

When a gate line (e.g., an n-th gate line) on which a sensing operation is to be performed is selected by the timing controller 124, a high voltage level line sensing preparation signal LSP is input to a stage circuit corresponding to the selected gate line. When a front carry signal C(k−2) together with the high voltage level line sensing preparation signal LSP are input to the stage circuit for a period P1 to P2, the first transistor T11 and the second transistor T12 included in the line selector 502 are turned on such that the M node is charged to a voltage level of the front carry signal C(k−2).

When a low voltage level line sensing preparation signal LSP is input to the stage circuit for a period P2 to P3, the first transistor T11 and the second transistor T12 are turned off, while a voltage of the M node is maintained at a high voltage level due to the voltage stored in the pre-charging capacitor CA.

When a reset signal RESET is input to the stage circuit for a period P3 to P4, the fourth transistor T14 and the fifth transistor T15 included in the line selector 502 are turned on based on the reset signal RESET, and the charged voltage of the M node, such that the Q node is charged to the first high-potential voltage GVDD1 level. Further, when the reset signal RESET is input for the P3 to P4, the second transistor T52 and the third transistor T53 included in the QB node stabilizer 510 are turned on based on the reset signal RESET and the charged voltage of the M node, such that the QB node is discharged to the third low-potential voltage GVSS3 level.

When a high voltage level scan clock signal SCCLK(n) is input to the stage circuit for a period P4 to P5, the boosting capacitor CS1 bootstraps the Q node voltage to a boosting voltage level higher than the first high-potential voltage GVDD1 level. Accordingly, a gate signal SCOUT(n) for a scan operation of the n-th gate line is output for the period P4 to P5.

When a panel on signal POS is input to the stage circuit for a period P5 to P6, the sixth transistor T16 and the seventh transistor T17 included in the line selector 502 are turned on, such that the Q node is discharged to the third low-potential voltage GVSS3 level. When the Q node has been discharged to the third low-potential voltage GVSS3 level, the fourth transistor T44 included in the inverter 508 is turned off. The second high-potential voltage GVDD2 is input to a gate of the first transistor T41, such that the first transistor T41 is turned on. When the first transistor T41 is turned on, the QB node is charged to the second high-potential voltage GVDD2 level.

Subsequently, when a high voltage level line sensing preparation signal LSP is input to the stage circuit for a period P7 to P8, the stage circuit is initialized.

Hereinafter, a configuration and an operation process of a stage circuit according to another embodiment of the present disclosure having a smaller number of transistors than the number of the transistors included in the stage circuit shown in FIG. 5 will be described below. For example, the stage circuit shown in FIG. 8 has fewer transistors than the stage circuit shown in FIG. 5, and can take up less real estate allowing for a decreased bezel size.

Figure 8:
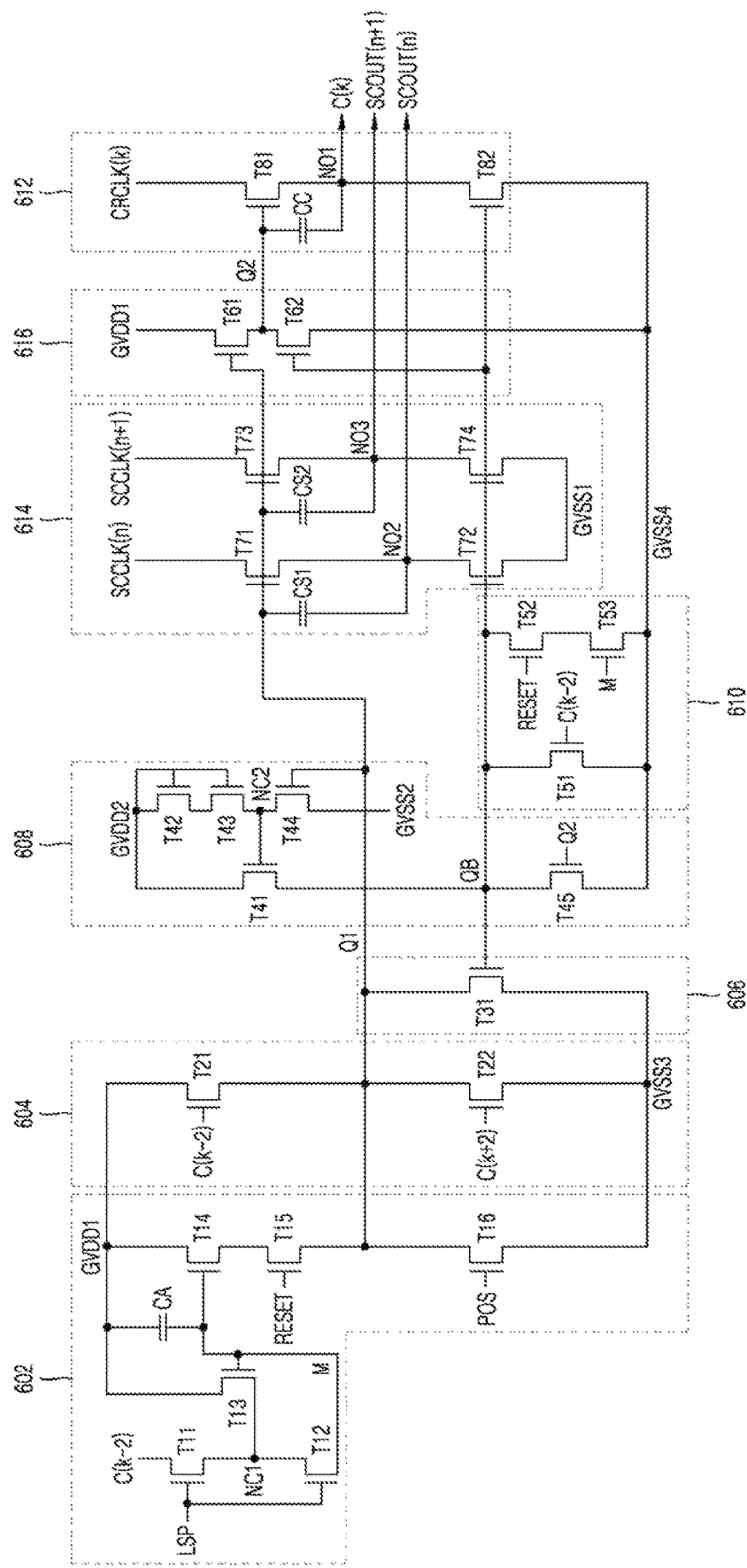
FIG. 8 is a circuit diagram of a stage circuit according to another embodiment of the present disclosure.

FIG. 8 is a circuit diagram of a stage circuit according to another embodiment of the present disclosure.

The stage circuit shown in FIG. 8 can be one stage circuit among the first to k-th stage circuits ST(1) to ST(k) shown in FIG. 4. Referring to FIG. 8, the stage circuit according to one embodiment of the present disclosure includes an M node, a Q1 node, a Q2 node, and a QB node. Further, the stage circuit according to one embodiment of the present disclosure includes a line selector 602, a Q1 node controller 604, a Q1 node stabilizer 606, an inverter 608, a QB node stabilizer 610, a carry signal output module 612 (e.g., a carry signal output circuit portion), a gate signal output module 614 (e.g., a gate signal output circuit portion), and a Q2 node controller 616.

The line selector 602 operates in response to an input of the line sensing preparation signal LSP to charge the M node based on a front carry signal C(k−2). Further, the line selector 602 operates in response to an input of the reset signal RESET to charge the Q node to the first high-potential voltage GVDD1 level based on a charged voltage of the M node. Further, the line selector 602 operates in response to an input of the panel on signal POS to discharge or reset the Q node to the second low-potential voltage GVSS2 level.

The line selector 602 includes first to sixth transistors T11 to T16, and a pre-charging capacitor CA.

The first transistor T11 and the second transistor T12 are connected to and disposed between the first high-potential voltage line for delivering the first high-potential voltage GVDD1 and the M node. Further, the first transistor T11 and the second transistor T12 are connected in series with each other.

The first transistor T11 operates in response to an input of the line sensing preparation signal LSP to output a front carry signal C(k−2) to a first connection node NC1. The second transistor T12 operates in response to an input of the line sensing preparation signal LSP to electrically connect the first connection node NC1 to the M node. For example, when the line sensing preparation signal LSP having a high level voltage is input to the first transistor T11 and the second transistor T12, the first transistor T11 and the second transistor T12 are simultaneously turned on to charge the M node to the first high-potential voltage GVDD1 level.

The third transistor T13 is turned on when a voltage level of the M node is at a high voltage level and thus supplies the first high-potential voltage GVDD1 to the first connection node NC1. When the first high-potential voltage GVDD1 is supplied to the first connection node NC1, a voltage between a gate voltage of the first transistor T11 and a voltage of the first connection node NC1 increases. Therefore, when a low level line sensing preparation signal LSP is input to the gate of the first transistor T11 such that the first transistor T11 is turned off, the first transistor T11 can be maintained in a completely turned-off state due to the difference between the gate voltage of the first transistor T11 and the voltage of the first connection node NC1. Accordingly, current leakage from the first transistor T11 is prevented and thus a voltage drop of the M node are prevented, so that the voltage of the M node can be stably maintained.

The pre-charging capacitor CA is connected to and disposed between the first high-potential voltage line for delivering the first high-potential voltage GVDD1 and the M node, and stores therein a difference voltage between the first high-potential voltage GVDD1 and the voltage charged to the M node. When the first transistor T11, the second transistor T12, and the third transistor T13 are turned on, the pre-charging capacitor CA stores therein a high level voltage of the front carry signal C(k−2). When the first transistor T11, the second transistor T12, and the third transistor T13 are turned off, the pre-charging capacitor CA maintains the voltage of the M node using the stored voltage for a certain period of time.

The fourth transistor T14 and the fifth transistor T15 are connected to and disposed between the first high-potential voltage line for delivering the first high-potential voltage GVDD1 and the Q1 node. The fourth transistor T14 and the fifth transistor T15 are connected in series with each other.

The fourth transistor T14 and the fifth transistor T15 operate in response to the voltage of the M node and an input of the reset signal RESET to charge the Q1 node to the first high-potential voltage GVDD1. The fourth transistor T14 is turned on when the voltage of the M node is at a high voltage level and thus transmits the first high-potential voltage GVDD1 to a shared node between the fourth transistor T14 and the fifth transistor T15. The fifth transistor T15 is turned on based on a high voltage level reset signal RESET to supply a voltage of the shared node to the Q1 node. Therefore, when the fourth transistor T14 and the fifth transistor T15 are simultaneously turned on, the Q1 node is charged to the first high-potential voltage GVDD1.

The sixth transistor T16 is connected to and disposed between the Q1 node and the third low-potential voltage line that transmits the third low-potential voltage GVSS3.

The sixth transistor T16 operates in response to an input of the panel on signal POS to discharge or reset the Q1 node to the third low-potential voltage GVSS3.

The Q1 node controller 604 operates in response to an input of the front carry signal C(k−2) to charge the Q1 node to the first high-potential voltage GVDD1 level, and operates in response to an input of the rear carry signal C(k+2) to discharge the Q1 node to the third low-potential voltage GVSS3 level.

The Q1 node controller 604 includes a first transistor T21 and a second transistor T22.

The first transistor T21 is connected to and disposed between the first high-potential voltage line for delivering the first high-potential voltage GVDD1 and the Q1 node.

The first transistor T21 operates in response to an input of the front carry signal C(k−2) to charge the Q1 node to the first high-potential voltage GVDD1 level. The first transistor T21 is turned on based on an input of the front carry signal C(k−2) and thus supplies the first high-potential voltage GVDD1 to the Q1 node.

The second transistor T22 is connected to and disposed between the Q1 node and the third low-potential voltage line for delivering the third low-potential voltage GVSS3.

The second transistor T22 operates in response to an input of the rear carry signal C(k+2) to discharge the Q1 node to the third low-potential voltage GVSS32 level. The second transistor T22 is turned on based on an input of the rear carry signal C(k+2) and thus supplies the third low-potential voltage GVSS3 to the Q1 node.

The Q1 node stabilizer 606 operates in response to the voltage of the QB node to discharge the Q1 node to the third low-potential voltage GVSS3 level.

The Q1 node stabilizer 606 includes a first transistor T31.

The first transistor T31 is connected to and disposed between the Q node and the third low-potential voltage line for delivering the third low-potential voltage GVSS3.

The first transistor T31 operates in response to the voltage of the QB node to discharge the Q1 node to the third low-potential voltage GVSS3 level. The first transistor T31 is turned on when the voltage of the QB node is at a high voltage level and thus supplies the third low-potential voltage GVSS3 to the Q1 node.

The inverter 608 changes a voltage level of the QB node based on the voltage level of the Q1 node.

The inverter 608 includes first to fifth transistors T41 to T45.

The second transistor T42 and the third transistor T43 are connected to and disposed between the second high-potential voltage line for delivering the second high-potential voltage GVDD2 and a third connection node NC3. The second transistor T42 and the third transistor T43 are connected in series with each other.

The second transistor T42 and the third transistor T43 operate in response to the second high-potential voltage GVDD2 to supply the second high-potential voltage GVDD2 to the third connection node NC3. The second transistor T42 is turned on based on the second high-potential voltage GVDD2 to supply the second high-potential voltage GVDD2 to a shared node between the second transistor T42 and the third transistor T43. The third transistor T43 is turned on based on the second high-potential voltage GVDD2 to electrically connect the shared node between the second transistor T42 and the third transistor T43 to the third connection node NC3. Therefore, when the second transistor T42 and the third transistor T43 are simultaneously turned on based on the second high-potential voltage GVDD2, the third connection node NC3 is charged to the second high-potential voltage GVDD2 level.

The fourth transistor T44 is connected to and disposed between the third connection node NC3 and the second low-potential voltage line for delivering the second low-potential voltage GVSS2.

The fourth transistor T44 operates in response to a voltage of the Q node, and thus supplies the second low-potential voltage GVSS2 to the third connection node NC3. The fourth transistor T44 is turned on when the voltage of the Q node is at a high voltage level to discharge or reset the third connection node NC3 to the second low-potential voltage GVSS2 level.

The first transistor T41 is connected to and disposed between the second high-potential voltage line for delivering the second high-potential voltage GVDD2 and the QB node.

The first transistor T41 operates in response to a voltage of the third connection node NC3 to supply the second high-potential voltage GVDD2 to the QB node. The first transistor T41 is turned on when the voltage of the third connection node NC3 is at a high voltage level to charge the QB node to the second high-potential voltage GVDD2 level.

The fifth transistor T45 is connected to and disposed between the QB node and the fourth low-potential voltage line for delivering the fourth low-potential voltage GVSS4.

The fifth transistor T45 operates in response to a voltage of the Q2 node, and thus supplies the fourth low-potential voltage GVSS4 to the QB node. The fifth transistor T45 is turned on when the voltage of the Q2 node is at a high voltage level and thus discharge or reset the QB node to the fourth low-potential voltage GVSS4 level.

The QB node stabilizer 610 operates in response to an input of the front carry signal C(k−2), an input of the reset signal, and a charged voltage of the M node to discharge the QB node to the fourth low-potential voltage GVSS4 level.

The QB node stabilizer 610 includes first to third transistors T51 to T53.

The first transistor T51 is connected to and disposed between the QB node and the fourth low-potential voltage line for delivering the fourth low-potential voltage GVSS4.

The first transistor T51 operates in response to an input of the front carry signal C(k−2), and thus supplies the fourth low-potential voltage GVSS4 to the QB node. The first transistor T51 is turned on when the voltage of the Q1 node is at a high voltage level and thus discharges or resets the QB node to the fourth low-potential voltage GVSS4 level.

The second transistor T52 and the third transistor T53 are connected to and disposed between the QB node and the fourth low-potential voltage line for delivering the fourth low-potential voltage GVSS4. The second transistor T52 and the third transistor T53 are connected in series with each other.

The second transistor T52 and the third transistor T53 operate in response to an input of the reset signal and a charged voltage of the M node to discharge the QB node to the fourth low-potential voltage GVSS4 level. The third transistor T53 is turned on when the voltage of the M node is at a high voltage level and thus supplies the fourth low-potential voltage GVSS4 to a shared node between the second transistor T52 and the third transistor T53. The second transistor T52 is turned on based on an input of the reset signal RESET, such that a shared node between the second transistor T52 and the third transistor T53 is electrically connected to the QB node. Therefore, when the reset signal RESET is input while the voltage of the M node is at a high voltage level, the second transistor T52 and the third transistor T53 are simultaneously turned on to discharge or reset the QB node to the fourth low-potential voltage GVSS4 level.

The carry signal output module 612 operates based on a voltage level of the Q node or a voltage level of the QB node to output the carry signal C(k) based on a voltage level of the carry clock signal CRCLK(k) or the fourth low-potential voltage GVSS4 level.

The carry signal output module 612 includes a first transistor T81, a second transistor T82, and a boosting capacitor CC.

The first transistor T81 is connected to and disposed between the clock signal line for delivering the carry clock signal CRCLK(k) and the QB node. The boosting capacitor CC is connected to and disposed between a gate and a source of first transistor T81.

The first transistor T81 operates in response to a voltage of the Q node to output a carry signal C(k) having a high level voltage based on the carry clock signal CRCLK(k) through a first output node NO1. The first transistor T81 is turned on when the voltage of the Q node is at a high voltage level and thus supplies the carry clock signal CRCLK(k) having a high level voltage to the first output node NO1. Accordingly, a carry signal C(k) having a high level voltage is output.

When the carry signal C(k) is output, the boosting capacitor CC bootstraps the voltage of the Q node to a boosting voltage level higher than the first high-potential voltage GVDD1 level in a synchronized manner with the high voltage level carry clock signal CRCLK(k). When the voltage of the Q node is bootstrapped, the high voltage level carry clock signal CRCLK(k) can be output as the carry signal C(k) quickly and without distortion.

The second transistor T82 operates in response to a voltage of the QB node to output a low level voltage carry signal C(k) based on the fourth low-potential voltage GVSS4 through the first output node NO1. The second transistor T82 is turned on when the voltage of the QB node is at a high voltage level and thus supplies the fourth low-potential voltage GVSS4 to the first output node NO1. Accordingly, a low level voltage carry signal C(k) is output.

The gate signal output module 614 operates based on a voltage level of the Q node or a voltage level of the QB node to output each of the gate signals SCOUT(n) and SCOUT(n+1) based on a voltage level of each of the scan clock signals SCCLK(n) and SCCLK(n+1) or the first low-potential voltage GVSS1 level.

The gate signal output module 614 includes first to fourth transistors T71 to T74, and boosting capacitors CS1 and CS2.

The first transistor T71 is connected to and disposed between the QB node and the clock signal line that transmits the scan clock signal SCCLK(n). The boosting capacitor CS1 is connected to and disposed between a gate and a source of the first transistor T71.

The first transistor T71 operates in response to the voltage of the Q node to output a gate signal SCOUT(n) having a high level voltage based on the scan clock signal SCCLK(n) through the second output node NO2. The first transistor T71 is turned on when the voltage of the Q node is at a high voltage level and thus supplies the scan clock signal SCCLK(n) having a high voltage level to the second output node NO2. Accordingly, a gate signal SCOUT(n) having a high level voltage is output.

When the gate signal SCOUT(n) is output, the boosting capacitor CS1 bootstraps the voltage of the Q node to a boosting voltage level higher than the first high-potential voltage GVDD1 level in a synchronized manner with the high voltage level scan clock signal SCCLK(n). When the voltage of the Q node is bootstrapped, the high voltage level scan clock signal SCCLK(n) can be output as the gate signal SCOUT(n) quickly and without distortion.

The second transistor T72 operates in response to the voltage of the QB node to output a gate signal SCOUT(n) having a low level voltage based on the first low-potential voltage GVSS1 through the second output node NO2. The second transistor T72 is turned on when the voltage of the QB node is at a high voltage level and thus supplies the first low-potential voltage GVSS1 to the second output node NO2. Accordingly, a gate signal SCOUT(n) having a low level voltage is output.

The third transistor T73 is connected to and disposed between the QB node and the clock signal line that transmits the scan clock signal SCCLK(n+1). The boosting capacitor CS2 is connected to and disposed between a gate and a source of the third transistor T73.

The third transistor T73 operates in response to the voltage of the Q node to output a gate signal SCOUT(n+1) having a high level voltage based on the scan clock signal SCCLK(n+1) through the third output node NO3. The third transistor T73 is turned on when the voltage of the Q node is at a high voltage level and thus supplies the scan clock signal SCCLK(n+1) having a high level voltage to the third output node NO3. Accordingly, a gate signal SCOUT(n+1) having a high level voltage is output.

When the gate signal SCOUT(n+1) is output, the boosting capacitor CS2 bootstraps the voltage of the Q node to a boosting voltage level higher than the first high-potential voltage GVDD1 level in a synchronized manner with the high voltage level scan clock signal SCCLK(n+1). When the voltage of the Q node is bootstrapped, the high voltage level scan clock signal SCCLK(n+1) can be output as the gate signal SCOUT(n+1) quickly and without distortion.

The fourth transistor T74 operates in response to a voltage of the QB node to output a gate signal SCOUT(n+1) having a low level voltage based on the first low-potential voltage GVSS1 through the third output node NO3. The fourth transistor T74 is turned on when the voltage of the QB node is at a high voltage level and thus supplies the first low-potential voltage GVSS1 to the third output node NO3. Accordingly, a gate signal SCOUT(n+1) having a low level voltage is output.

The Q2 node controller 616 adjusts a voltage of the Q2 node based on a voltage level of the Q1 node or a voltage level of the QB node. The Q2 node controller 616 charges the Q2 node to the first high-potential voltage GVDD1 level when the Q1 node has been charged to first high-potential voltage GVDD1 level. The Q2 node controller 616 discharges the Q2 node to the fourth low-potential voltage GVSS4 level when the QB node has been charged to the second high-potential voltage level GVDD2.

The Q2 node controller 616 includes a first transistor T61 and a second transistor T62.

The first transistor T61 and the second transistor T62 are connected to and disposed between the first high-potential voltage line for delivering the first high-potential voltage GVDD1 and the fourth low-potential voltage line for delivering the fourth low-potential voltage GVSS4. The first transistor T61 and the second transistor T62 are connected in series with each other.

The first transistor T61 operates in response to the voltage of the Q1 node to charge the Q2 node to the first high-potential voltage GVDD1 level. The first transistor T61 is turned on when the voltage of the Q1 node is at a high voltage level and thus supplies the first high-potential voltage GVDD1 to the Q2 node.

The second transistor T62 operates in response to the voltage of the QB node to discharge or reset the Q2 node to the fourth low-potential voltage GVSS4 level. The second transistor T62 is turned on when the voltage of the QB node is at a high voltage level and thus supplies the fourth low-potential voltage GVSS4 to the Q2 node.

In the embodiment of FIG. 8, the Q2 node is connected to the gate of the first transistor T81 of the carry signal output module 612 and the gate of the fifth transistor T45 of the inverter 608. Therefore, each of the first transistor T81 of the carry signal output module 612 and the fifth transistor T45 of the inverter 608 is turned on or off based on a voltage of the Q2 node.

In the embodiment shown in FIG. 8, each stage circuit receives the two high-potential voltages GVDD1 and GVDD2 set to different levels and the four low-potential voltages GVSS1, GVSS2, GVSS3, and GVSS4 set to different levels. For example, the first high-potential voltage GVDD1 can be set to 20V, and the second high-potential voltage GVDD2 can be set to 16V. The first low-potential voltage GVSS1 can be set to −6V, the second low-potential voltage GVSS2 can be set to −10V, the third low-potential voltage GVSS3 can be set to −12V, and the fourth low-potential voltage GVSS4 can be set to −14V. In still another example, the first low-potential voltage GVSS1 and the second low-potential voltage GVSS2 can be set to the same voltage, for example, −6V. These numerical values are just one example. The levels of the high-potential voltages and the low-potential voltages can vary based on embodiments.

Figure 9:
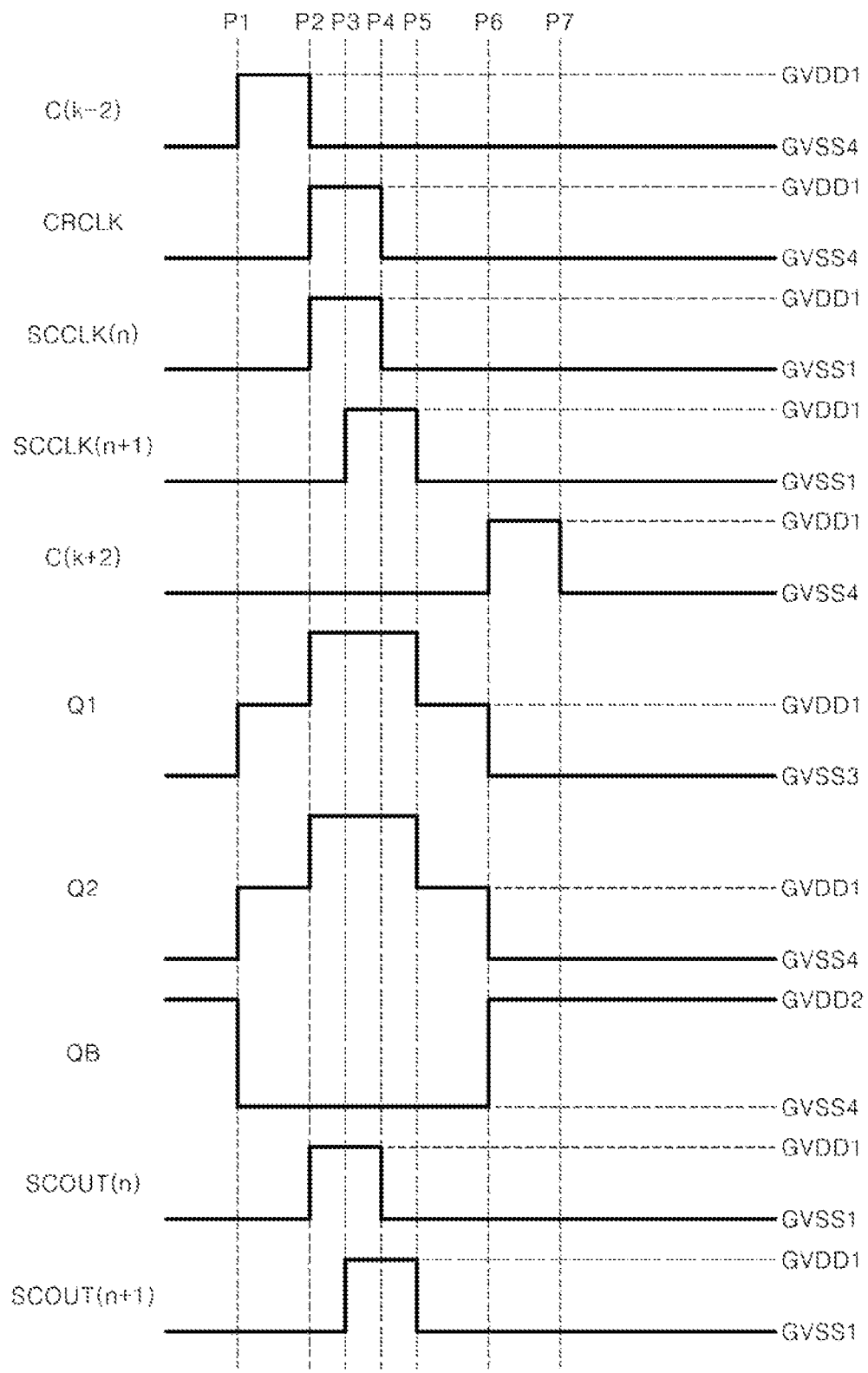
FIG. 9 shows a waveform of each of an input signal and an output signal when the stage circuit of FIG. 8 outputs a gate signal for image display.

FIG. 9 shows a waveform of each of an input signal and an output signal when the stage circuit of FIG. 8 outputs a gate signal for image display.

When a high voltage level front carry signal C(k−2) is input to the stage circuit for a period P1 to P2, the first transistor T21 of the Q1 node controller 604 is turned on. Accordingly, the Q1 node is charged to the first high-potential voltage GVDD1 level. Further, when the Q1 node is charged to the first high-potential voltage GVDD1 level, the first transistor T81 of the Q2 node controller 616 is turned on. Accordingly, the Q2 node is charged to the first high-potential voltage GVDD1 level. Further, the first transistor T51 of the QB node stabilizer 610 is turned on based on the high voltage level front carry signal C(k−2), such that the QB node is discharged to the fourth low-potential voltage GVSS4 level.

When a high voltage level scan clock signal SCCLK(n) together with a high voltage level carry clock signal CRCLK(k) are input to the stage circuit for a period P2 to P3, the boosting capacitor CS1 bootstraps the voltage of the Q1 node to a boosting voltage level higher than the first high-potential voltage GVDD1 level. Accordingly, for the period P2 to P3, a gate signal SCOUT(n) for image display of an n-th line is output from the stage circuit.

Further, when a high voltage level scan clock signal SCCLK(n+1) is input to the stage circuit for a period P3 to P4 partially overlapping the period P2 to P3, the boosting capacitor CS2 bootstraps the voltage of the Q1 node to a boosting voltage level higher than the first high-potential voltage GVDD1 level. Accordingly, for the period P3 to P4, a gate signal SCOUT(n+1) for image display of an (n+1)-th line is output from the stage circuit.

Since the scan clock signal is not input to the stage circuit for a period P5 to P6, the voltage of the Q1 node is charged back to the first high-potential voltage GVDD1 level.

For a period P1 to P6 when the Q1 node has been charged to the first high-potential voltage GVDD1 level or the boosting voltage level, the voltage of the QB node is maintained at the fourth low-potential voltage GVSS4 level.

When a high voltage level rear carry signal C(k+2) is input to the stage circuit for a period P6 to P7, the second transistor T22 of the Q1 node controller 604 is turned on. Accordingly, the Q1 node is discharged to the third low-potential voltage GVSS3 level. When the Q1 node has been discharged to the third low-potential voltage GVSS3 level, the fourth transistor T44 included in the inverter 608 is turned off. The second high-potential voltage GVDD2 is input to the gate of the first transistor T41, such that the first transistor T41 is turned on.

When the first transistor T41 is turned on, the QB node is charged to the second high-potential voltage GVDD2 level. Further, when the QB node has been charged to the second high-potential voltage GVDD2 level, the second transistor T82 of the Q2 node controller 616 is turned on. Accordingly, the Q2 node is discharged to the fourth low-potential voltage GVSS4 level.

Figure 10:
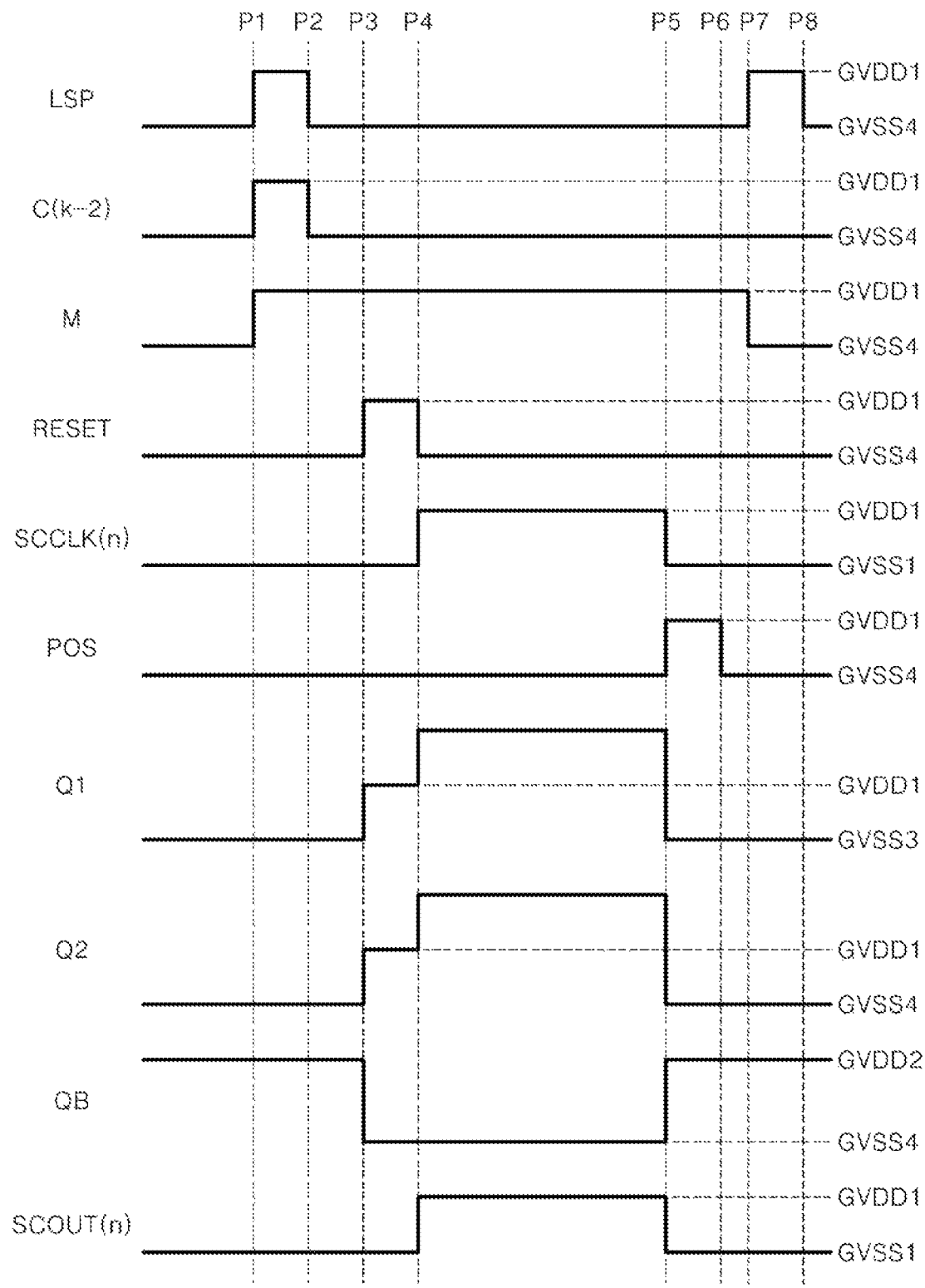
FIG. 10 shows a waveform of each of an input signal and an output signal when the stage circuit of FIG. 8 outputs a gate signal for sensing according to one embodiment of the present disclosure.

FIG. 10 shows a waveform of each of an input signal and an output signal when the stage circuit of FIG. 8 outputs a gate signal for sensing.

When a gate line (e.g., an n-th gate line) on which an sensing operation is to be performed is selected by the timing controller 124, a high voltage level line sensing preparation signal LSP is input to a stage circuit corresponding to the selected gate line. When a front carry signal C(k−2) together with a high voltage level line sensing preparation signal LSP are input to the stage circuit for a period P1 to P2, the first transistor T11 and the second transistor T12 included in the line selector 602 are turned on such that the M node is charged to a voltage level of the front carry signal C(k−2).

When a low level line sensing preparation signal LSP is input to the stage circuit for a period P2 to P3, the first transistor T11 and the second transistor T12 are turned off, while the voltage of the M node is maintained at a high voltage level due to the voltage stored in the pre-charging capacitor CA.

When a reset signal RESET is input to the stage circuit for a period P3 to P4, the fourth transistor T14 and fifth transistor T15 included in the line selector 602 are turned on based on the reset signal RESET and the charged voltage of the M node, such that the Q1 node is charged to the first high-potential voltage GVDD1 level. Further, when the Q1 node has been charged to the first high-potential voltage GVDD1 level, the first transistor T81 of the Q2 node controller 616 is turned on. Accordingly, the Q2 node is charged to the first high-potential voltage GVDD1 level. Further, when the reset signal RESET is input to the stage circuit for the P3 to P4, the second transistor T52 and third transistor T53 included in the QB node stabilizer 610 are turned on based on the reset signal RESET and the charged voltage of the M node, such that the QB node is discharged to the second low-potential voltage GVSS2 level.

When a high voltage level scan clock signal SCCLK(n) is input to the stage circuit for a period P4 to P5, the boosting capacitor CS1 bootstraps the voltage of the Q1 node to a boosting voltage level higher than the first high-potential voltage GVDD1 level. Accordingly, a gate signal SCOUT(n) for a scan operation of an n-th gate line is output from the stage circuit for the period P4 to P5.

When a panel on signal POS is input to the stage circuit for a period P5 to P6, the sixth transistor T16 included in the line selector 602 is turned on such that the Q1 node is discharged to the third low-potential voltage GVSS3 level. When the Q1 node is discharged to the third low-potential voltage GVSS3 level, the fourth transistor T44 included in the inverter 608 is turned off, and the second high-potential voltage GVDD2 is input to the gate of the first transistor T41, such that the first transistor T41 is turned on. When the first transistor T41 is turned on, the QB node is charged to the second high-potential voltage GVDD2 level. Further, when the QB node has been charged to the second high-potential voltage GVDD2 level, the second transistor T82 of the Q2 node controller 616 is turned on. Accordingly, the Q2 node is discharged to the fourth low-potential voltage GVSS4 level.

Thereafter, when a high voltage level line sensing preparation signal LSP is input to the stage circuit for a period P7 to P8, the stage circuit is initialized.

Advantageously, the stage circuit shown in FIG. 8 includes a smaller number of transistors than in the stage circuit shown in FIG. 5. That is, the stage circuit shown in FIG. 8 does not include the nine transistors T17, T22, T23, T24, T25, T26, T27, T28, and T32 among the transistors of the stage circuit shown in FIG. 5, but rather, includes two new transistors T81 and T82. Further, as can be seen from the waveforms of the input/output signals shown in FIGS. 6 and 7 and FIGS. 9 and 10, the stage circuit in FIG. 8 can stably output the carry signal and the gate signal in the same manner as the stage circuit in FIG. 5. In other words, the smaller stage circuit shown in FIG. 8 can produce the same type of waveforms according to the same type of timings as the stage circuit shown in FIG. 5, while using fewer circuit components.

As a result, when the stage circuit shown in FIG. 8 including the smaller number of transistors is used, a size of the stage circuit and thus a size of the gate driver circuit can be reduced, and accordingly, a size of the display area of the display device can be made even larger. Further, even when the number of transistors in the stage circuit of FIG. 8 is reduced, the stage circuit of FIG. 8 can output the gate signal in a stable manner as in the stage circuit shown in FIG. 5.

Further, the stage circuit in FIG. 8 has a simpler circuit structure compared to that of the stage circuit of FIG. 5. Therefore, a product design and a manufacturing process thereof becomes simpler and more efficient, which can also reduce costs.

Further, in the stage circuit of FIG. 5, the same low-potential voltage, that is, the second low-potential voltage GVSS2 is applied to the line selector 502, the Q node controller 504, the Q node stabilizer 506, the inverter 508, the QB node stabilizer 510, and the carry signal output module 512. However, in the stage circuit shown in FIG. 8, the voltage level of the low-potential voltage (the third low-potential voltage GVSS3) supplied to the line selector 602, the Q1 node controller 604, and the Q1 node stabilizer 606 is set to be different from the voltage level of the low-potential voltage (the fourth low-potential voltage GVSS4) supplied to the inverter 608, the QB node stabilizer 610, and the carry signal output module 612.

Thus, the fourth low-potential voltage GVSS4 having a lower voltage level than that of the third low-potential voltage GVSS3 is supplied to the inverter 608, the QB node stabilizer 610, and the carry signal output module 612. Thus, when the transistors included in the inverter 608, the QB node stabilizer 610, and the carry signal output module 612 are turned off based on the fourth low-potential voltage GVSS4, the inverter 608, the QB node stabilizer 610, and the carry signal output module 612 can be maintained at a completely turned-off state. Therefore, the leakage current from the transistors included in the inverter 608, the QB node stabilizer 610, and the carry signal output module 612 can be prevented, thereby enabling a more stable operation of the stage circuit.

Further, the stage circuit shown in FIG. 8 includes the Q2 node controller 616 which controls the voltage of the Q2 node. The Q2 node is connected to the gate of the first transistor T61 of the carry signal output module 612. Therefore, in the stage circuit of FIG. 8, a carry signal output from the carry signal output module 612 is controlled based on the voltage supplied from not the Q1 node but the Q2 node. As a result, when the carry signal output module 612 outputs the carry signal, the current leakage therefrom does not occur such that the carry signal is output in a more stable manner.

Further, in the stage circuit shown in FIG. 8, the Q2 node is connected to the gate of the fifth transistor T45 included in the inverter 608. The fifth transistor T45 is turned on or off based on the voltage of the Q2 node other than the Q1 node. The Q2 node is discharged to the low-potential voltage (the fourth low-potential voltage GVSS4) different from the low-potential voltage (the third low-potential voltage GVSS3) supplied to the Q1 node. Therefore, when the voltage of the Q2 node is at a low voltage level, the fifth transistor T45 is maintained in a completely turned off state. Thus, there is no leakage current from the fifth transistor T45 and the QB node is stably maintained in the discharged or reset state.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A gate driver circuit for a display device, the gate driver circuit comprising:
    a plurality of stage circuits, each stage circuit among the plurality of stage circuits being configured to supply a gate signal to one or more gate lines, and including an M node, a Q1 node, a Q2 node, and a QB node,
    wherein each stage circuit among the plurality of stage circuits further includes:
    a line selector configured to:
    in response to receiving a line sensing preparation signal, charge the M node based on a front carry signal,
    in response to receiving a reset signal, charge the Q1 node to a first high-potential voltage level, and
    in response to receiving a panel on signal, discharge the Q1 node to a third low-potential voltage level;
    a Q1 node controller configured to:
    in response to receiving the front carry signal, charge the Q1 node to the first high-potential voltage level, and
    in response to receiving an input of a rear carry signal, discharge the Q1 node to the third low-potential voltage level;
    a Q1 node stabilizer configured to discharge the Q1 node to the third low-potential voltage level when the QB node is charged to a second high-potential voltage level;
    an inverter configured to change a voltage level of the QB node based on a voltage level of the Q1 node;
    a QB node stabilizer configured to discharge the QB node to a fourth low-potential voltage level based on an input of the front carry signal, an input of the reset signal, and a charged voltage of the M node;
    a gate signal output circuit portion configured to output a gate signal based on a voltage level of a scan clock signal or a first low-potential voltage level; and
    a carry signal output circuit portion configured to output a carry signal based on a carry clock signal or the fourth low-potential voltage,
    wherein the first low-potential voltage level, the third low-potential voltage level, and the fourth low-potential voltage level are set to different values.

2. The gate driver circuit of claim 1, wherein the fourth low-potential voltage level is less than the third low-potential voltage level, and the third low-potential voltage level is less than the first low-potential voltage level.

3. The gate driver circuit of claim 1, wherein the line selector includes a sixth transistor connected to and disposed between the Q1 node and the third low-potential voltage, and
    wherein the sixth transistor is configured to operate in response to an input of the panel on signal to discharge the Q1 node to the third low-potential voltage level.

4. The gate driver circuit of claim 1, wherein the Q1 node controller includes:
    a first transistor connected to and disposed between the first high-potential voltage and the Q1 node, wherein the first transistor is configured to charge the Q1 node to the first high-potential voltage level in response to an input of the front carry signal; and
    a second transistor connected to and disposed between the Q1 node and the third low-potential voltage, wherein the second transistor is configured to discharge the Q1 node to the third low-potential voltage level in response to an input of the rear carry signal.

5. The gate driver circuit of claim 1, wherein the Q1 node stabilizer includes a single transistor.

6. The gate driver circuit of claim 1, wherein the Q1 node stabilizer includes a first transistor connected to and disposed between the Q1 node and the third low-potential voltage, and wherein the first transistor is configured to discharge the Q1 node to the third low-potential voltage level when the QB node is charged to the second high-potential voltage level.

7. The gate driver circuit of claim 1, wherein the inverter includes a fifth transistor connected to and disposed between the QB node and the fourth low-potential voltage, and
    wherein the fifth transistor is configured to discharge the QB node to the fourth low-potential voltage level when the Q2 node is charged to the first high-potential voltage level.

8. The gate driver circuit of claim 1, wherein the inverter includes a fourth transistor connected to and disposed between a second connection node and a second low-potential voltage, and wherein the second low-potential voltage level is different than each of the first low-potential voltage level, the third low-potential voltage level, and the fourth low-potential voltage level.

9. The gate driver circuit of claim 8, wherein the second low-potential voltage level is less than the first low-potential voltage level and is greater than the third low-potential voltage level.

10. The gate driver circuit of claim 1, wherein the gate driver circuit further comprises a Q2 node controller configured to: charge the Q2 node to the first high-potential voltage level when the Q1 node is charged to the first high-potential voltage level; and discharge the Q2 node to the fourth low-potential voltage level when the QB node is charged to the second high-potential voltage level.

11. The gate driver circuit of claim 10, wherein the Q2 node controller includes:
a first transistor connected to and disposed between the first high-potential voltage and the Q2 node, wherein the first transistor is configured to charge the Q2 node to the first high-potential voltage level when the Q1 node is charged to the first high-potential voltage level; and
a second transistor connected to and disposed between the Q2 node and the fourth low-potential voltage, wherein the second transistor is configured to discharge the Q2 node to the fourth low-potential voltage level when the QB node is charged to the second high-potential voltage level.

12. The gate driver circuit of claim 10, wherein the Q2 node controller is connected between the gate signal output circuit portion and the carry signal output circuit portion.

13. The gate driver circuit of claim 1, wherein the Q1 node controller includes only two transistors.

14. The gate driver circuit of claim 1, wherein an output side of the Q1 node controller is connected to an input side of the Q1 node stabilizer, and
wherein an input side of the Q2 node controller is connected to an output side of the gate signal output circuit portion and an output side of the Q2 node controller is connected to an input side of the carry signal output circuit portion.

15. A display device comprising:
a display panel including sub-pixels respectively disposed at intersections between gate lines and data lines;
a gate driver circuit configured to supply a scan signal to each of the gate lines;
a data driver circuit configured to supply a data voltage to each of the data lines; and
a timing controller configured to control the gate driver circuit and the data driver circuit,
wherein the gate driver circuit includes a plurality of stage circuits,
wherein each stage circuit among the plurality of stage circuits is configured to supply a gate signal to one or more gate lines, and includes an M node, a Q1 node, a Q2 node, and a QB node,
wherein each stage circuit among the plurality of stage circuits further includes:
a line selector configured to:
in response to an input of a line sensing preparation signal, charge the M node based on a front carry signal, or
in response to an input of a reset signal, charge the Q1 node to a first high-potential voltage level, or
in response to an input of a panel on signal, discharge the Q1 node to a third low-potential voltage level;
a Q1 node controller configured to:
in response to an input of the front carry signal, charge the Q1 node to the first high-potential voltage level, and
in response to an input of a rear carry signal, discharge the Q1 node to the third low-potential voltage level;
a Q1 node stabilizer configured to discharge the Q1 node to the third low-potential voltage level when the QB node has been charged to a second high-potential voltage level;
an inverter configured to change a voltage level of the QB node based on a voltage level of the Q1 node;
a gate signal output circuit portion configured to output a gate signal based on a voltage level of a scan clock signal or a first low-potential voltage level; and
a carry signal output circuit portion configured to output a carry signal based on a voltage level of a carry clock signal or the fourth low-potential voltage,
wherein the first low-potential voltage level, the third low-potential voltage level, and the fourth low-potential voltage level are set to different values.

16. The display device of claim 15, wherein the inverter includes a fifth transistor connected to and disposed between the QB node and the fourth low-potential voltage, and
wherein the fifth transistor is configured to discharge the QB node to the fourth low-potential voltage level when the Q2 node is charged to the first high-potential voltage level.

17. The display device of claim 15, wherein the inverter includes a fourth transistor connected to and disposed between a second connection node and a second low-potential voltage, and
wherein the second low-potential voltage level is different from each of the first low-potential voltage level, the third low-potential voltage level, and the fourth low-potential voltage level.

18. The display device of claim 15, wherein the gate driver circuit further comprises a Q2 node controller configured to: charge the Q2 node to the first high-potential voltage level when the Q1 node is charged to the first high-potential voltage level; and discharge the Q2 node to the fourth low-potential voltage level when the QB node is charged to the second high-potential voltage level.

19. The display device of claim 18, wherein the Q2 node controller includes:
a first transistor connected to and disposed between the first high-potential voltage and the Q2 node, wherein the first transistor is configured to charge the Q2 node to the first high-potential voltage level when the Q1 node is charged to the first high-potential voltage level; and
a second transistor connected to and disposed between the Q2 node and the fourth low-potential voltage, wherein the second transistor is configured to discharge the Q2 node to the fourth low-potential voltage level when the QB node is charged to the second high-potential voltage level.

20. A gate driver circuit comprising: at least one stage circuit configured to output gate signals, wherein each of the at least one stage circuit includes a first node, a second node, and a third node, wherein each the at least one stage circuit further includes: a line selector configured to: in response to an input of a line sensing preparation signal, charge the first node based on a front carry signal, or in response to an input of a reset signal, charge the second node to a first high-potential voltage level, or in response to an input of a panel on signal, discharge the second node to a third low-potential voltage level; a second node controller configured to: in response to receiving the front carry signal, charge the second node to the first high-potential voltage level, or in response to receiving an input of a rear carry signal, discharge the second node to the third low-potential voltage level; a second node stabilizer configured to discharge the second node to the third low-potential voltage level when the third node is charged to a second high-potential voltage level; a third node stabilizer configured to discharge the third node to a fourth low-potential voltage level based on an input of the front carry signal, an input of the reset signal, and a charged voltage of the first node; and a gate signal output circuit portion configured to output a gate signal based on a voltage level of a scan clock signal or a first low-potential voltage level, and wherein the first low-potential voltage level, the third low-potential voltage level, and the fourth low-potential voltage level are set to different values.

* * * * *